United States Patent [19]
Auchterlonie

[11] Patent Number: 5,003,260
[45] Date of Patent: Mar. 26, 1991

[54] INDUCTIVE POSITION SENSOR HAVING PLURAL PHASE WINDINGS ON A SUPPORT AND A DISPLACEABLE PHASE SENSING ELEMENT RETURNING A PHASE INDICATING SIGNAL BY ELECTROMAGNETIC INDUCTION TO ELIMINATE WIRE CONNECTIONS

[76] Inventor: Richard C. Auchterlonie, 743 International Blvd. #28, Houston, Tex. 77024

[21] Appl. No.: 453,615

[22] Filed: Dec. 20, 1989

Related U.S. Application Data

[63] Continuation-in-part of Ser. No. 175,760, Mar. 31, 1988, Pat. No. 4,893,077, which is a continuation-in-part of Ser. No. 55,422, May 28, 1987, Pat. No. 4,893,078.

[51] Int. Cl.$^5$ .......................... G01B 7/14; G01R 33/00
[52] U.S. Cl. .......................... 324/207.16; 324/207.24; 324/207.25
[58] Field of Search ............... 324/207, 208, 239, 262, 324/207.11, 207.13, 207.15, 207.16, 207.17, 207.22, 207.23, 207.24, 207.25; 340/870.36, 870.35, 870.31; 318/656–661

[56] References Cited

U.S. PATENT DOCUMENTS

| | | | |
|---|---|---|---|
| 3,223,889 | 12/1965 | Schweitzer, Jr. | 317/14 |
| 3,428,896 | 2/1969 | Schweitzer, Jr. | 324/117 |
| 3,473,100 | 11/1969 | Anger | 318/28 |
| 4,001,798 | 1/1977 | Robinson | 340/191 |
| 4,297,698 | 11/1981 | Pauwels et al. | 340/870.23 |
| 4,403,218 | 9/1983 | Beal et al. | 340/870.18 |
| 4,893,077 | 1/1990 | Auchterlonie | 324/262 |
| 4,893,078 | 1/1990 | Auchterlonie | 324/208 |

FOREIGN PATENT DOCUMENTS

WO88/09479 12/1988 PCT Int'l Appl. .

OTHER PUBLICATIONS

T. M. Palmer, "A Sensitive Magnetometer," Proc. of the IEEE, vol. 100, pp. 545–550, 1953.
W. J. Karwin et al., "An Improved Magnetometer for Deep Space Use," Proc. of NAECON, pp. 73–83, 1965.

*Primary Examiner*—Walter E. Snow
*Attorney, Agent, or Firm*—Richard C. Auchterlonie

[57] ABSTRACT

For enabling a resolver (120) to have absolute position sensing over a wide displacement range while still obtaining the resolution, accuracy and precision obtainable by operation in an incremental mode, the resolver is provided with a number of terminals ($\phi_1$, $\hat{\phi}_1$, $\phi_2$, $\hat{\phi}_2$) for providing offset pitch phase indications ($C_1$, $C_2$) as a function of position. A microcomputer (171) is programmed to execute a decoding procedure (160) for reading the offset pitch phase indications and from them computing the absolute position. This method is applicable to linear as well as rotary position sensing. By using multiplexing, digital signal processing and large-scale circuit integration (170) for interfacing the resolver (120) to the microcomputer (171), the method can achieve absolute position sensing with high reliability and low cost. The offset pitch phase indications are readily provided by inductive coupling between a multiplicity of windings (123, 124, 125, 126, 127), including a set of offset pitch windings (124, 125, 126, 127) connected to the terminals. A phase indicating signal is picked up using either a relatively moving pick-up device (50, 51, 52) or a stationary coil (123) linked by a ferromagnetic core (121). A radio-frequency powered modulator (409) is provided for wireless transmission of the phase indicating signal from the moving pick-up device. The offset pitch windings are formed by photolithography on a plurality of laminations or layers ($W_1$–$\hat{W}_4$), or by winding coils in proper registration, for example, on a multi-layer, multi-pitch coil form (530).

20 Claims, 13 Drawing Sheets

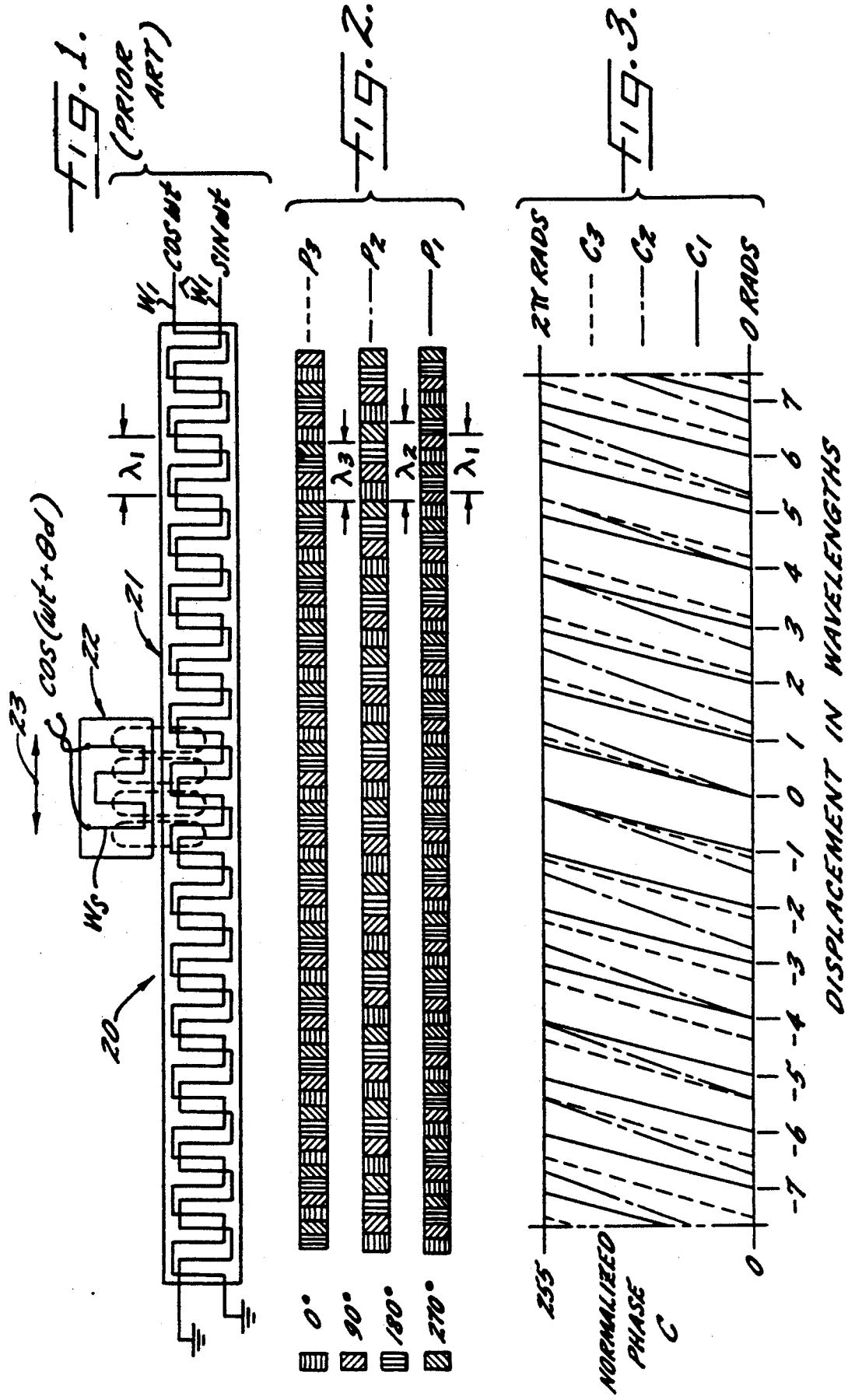

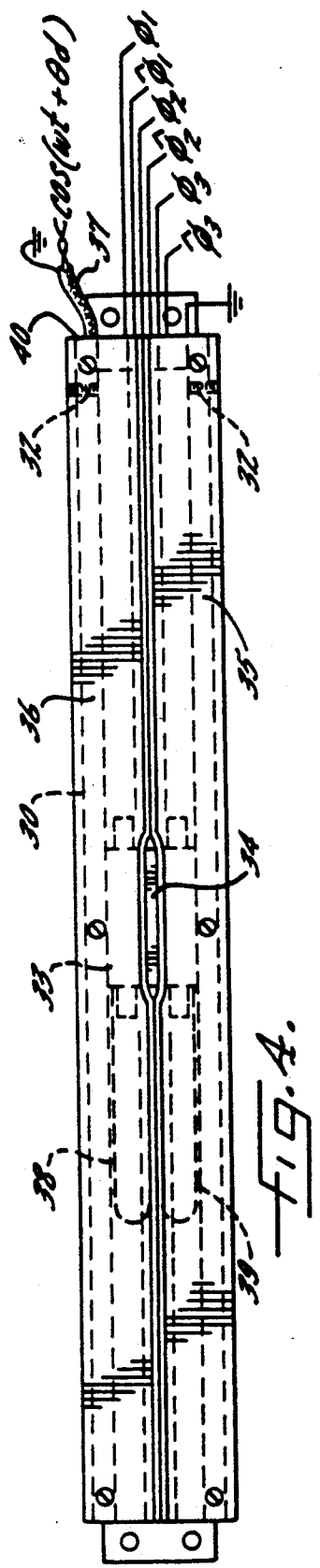
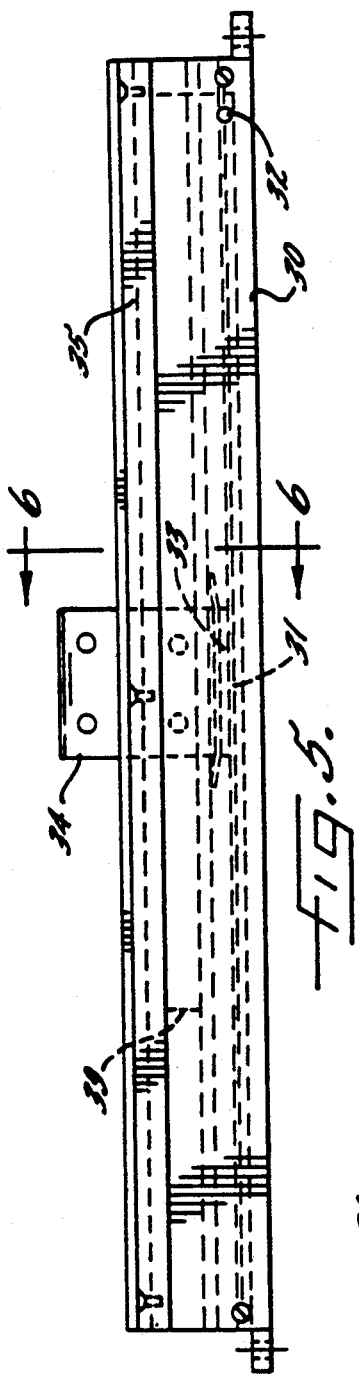
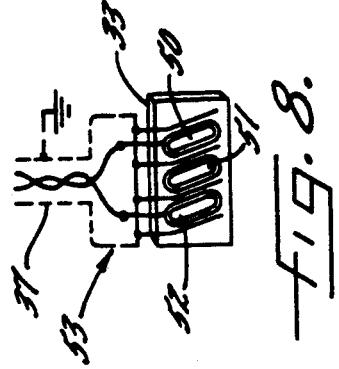
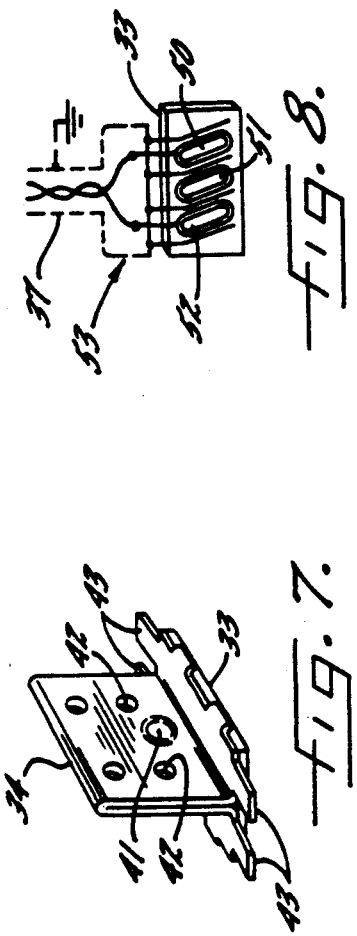
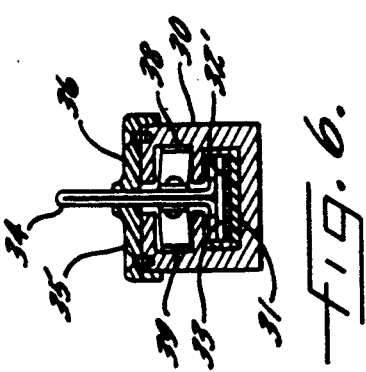

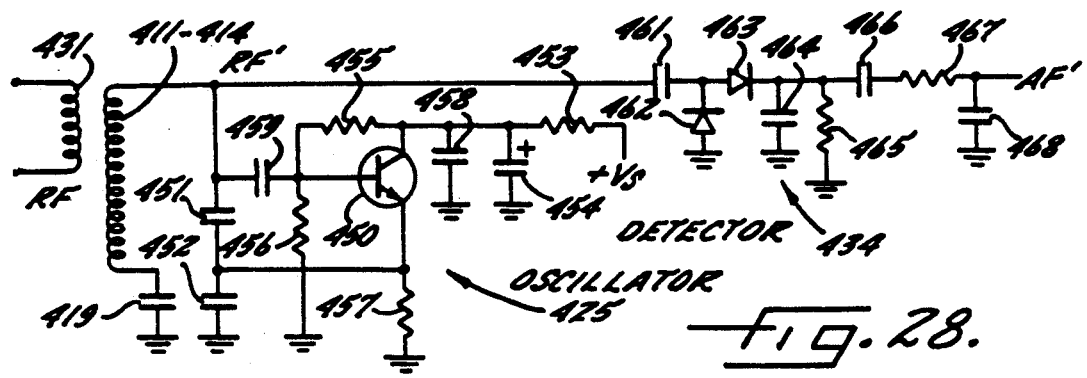
fig. 28.
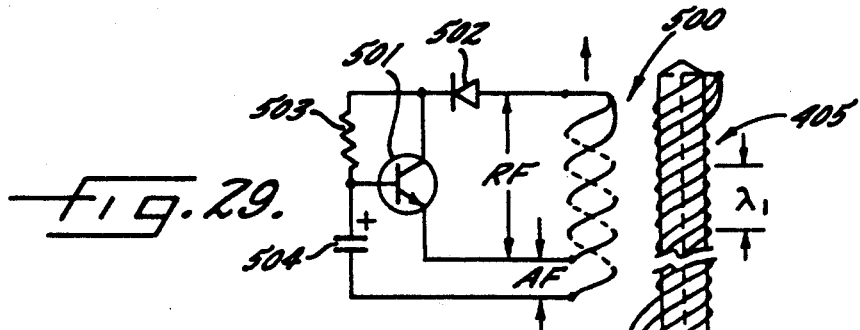
fig. 29.
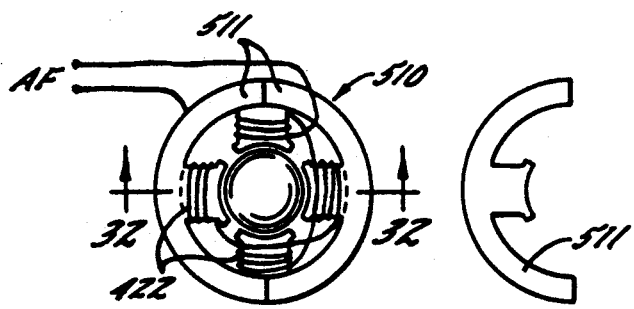
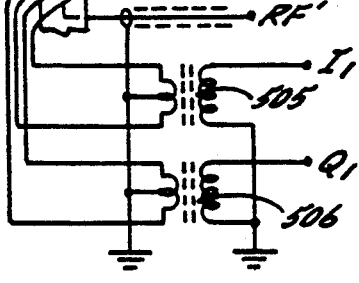
fig. 30.   fig. 31.
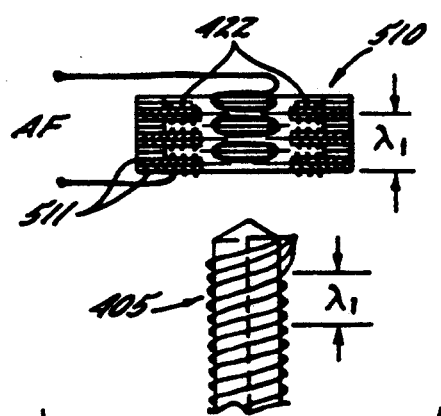
fig. 32.
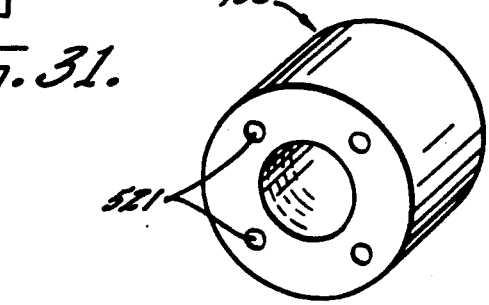
fig. 33.
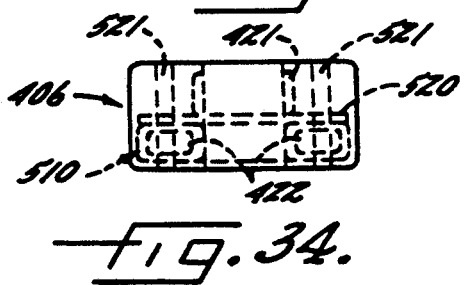
fig. 34.

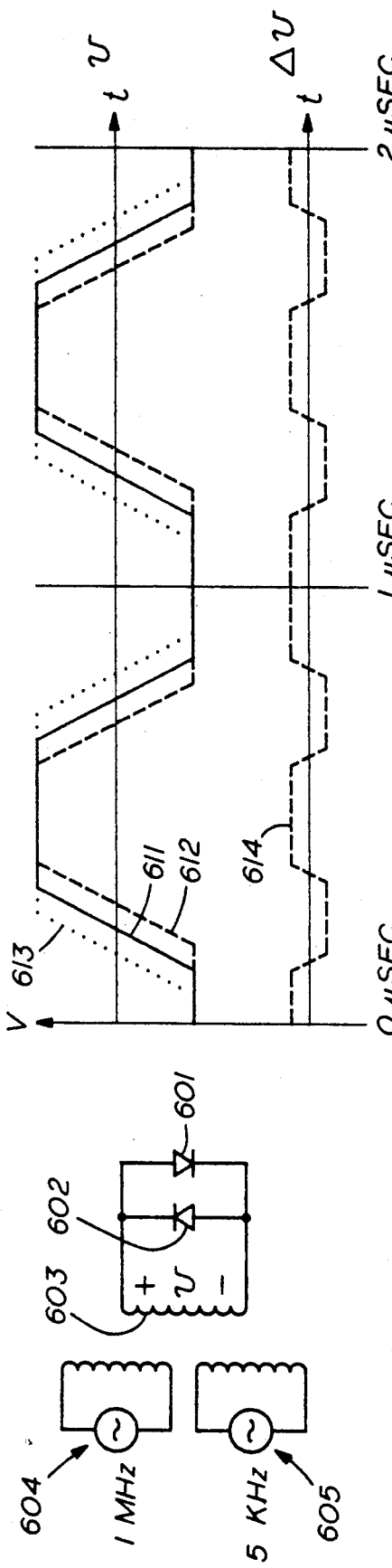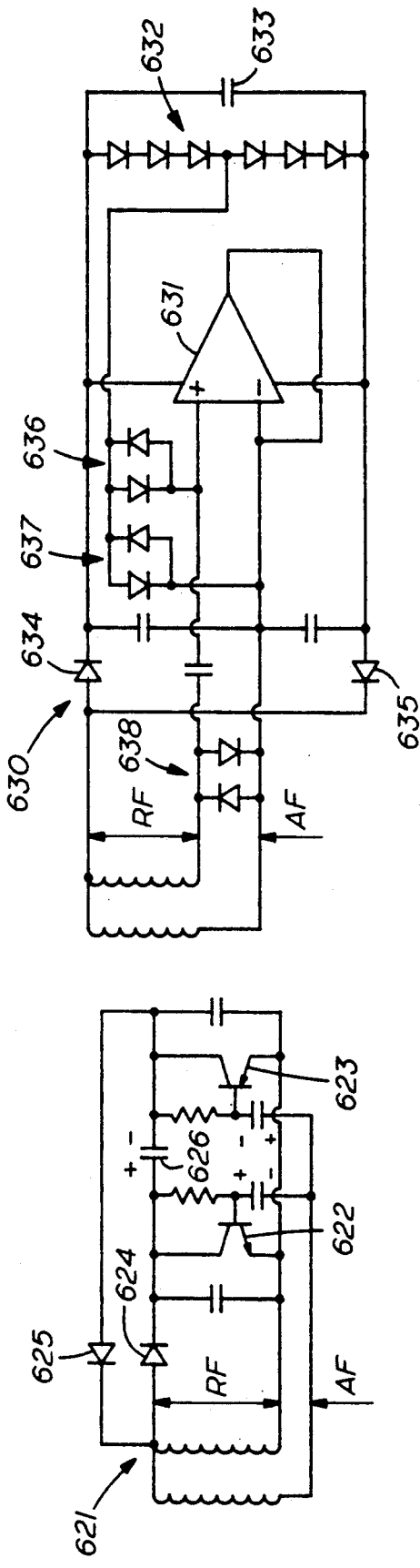

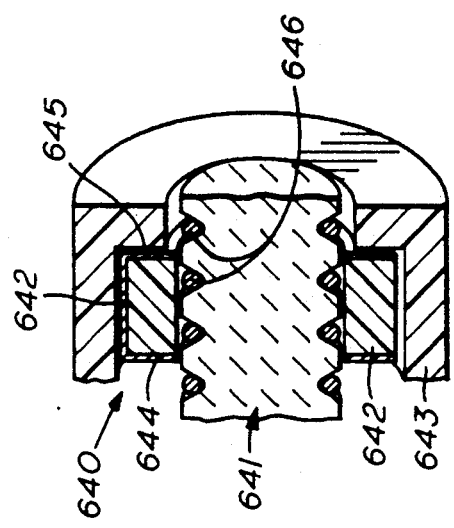
FIG. 47
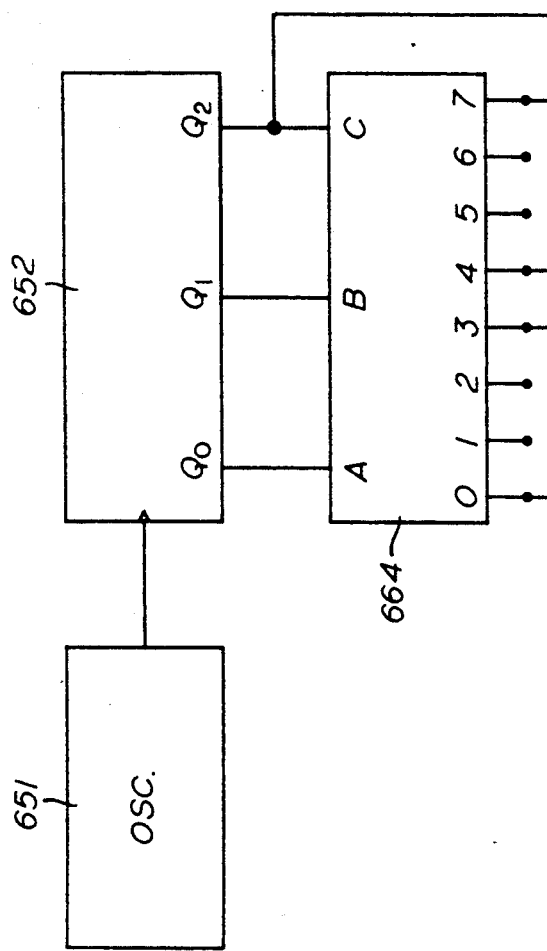
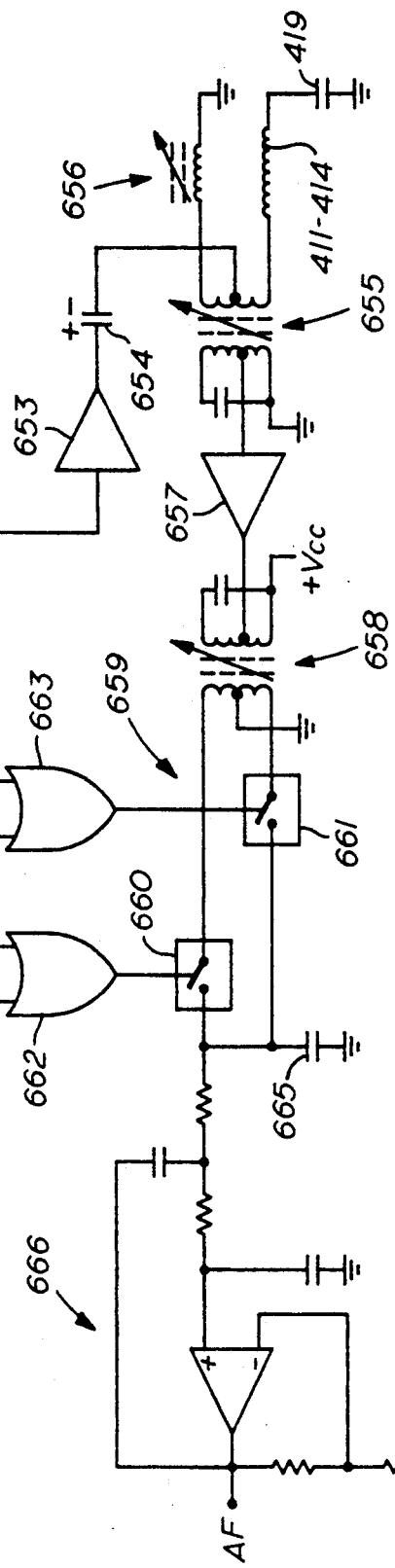
FIG. 48

INDUCTIVE POSITION SENSOR HAVING PLURAL PHASE WINDINGS ON A SUPPORT AND A DISPLACEABLE PHASE SENSING ELEMENT RETURNING A PHASE INDICATING SIGNAL BY ELECTROMAGNETIC INDUCTION TO ELIMINATE WIRE CONNECTIONS

RELATED APPLICATIONS

The present application is a continuation-in-part of U.S. Ser. 07/175,760 filed Mar. 31, 1988, and issued Jan. 9, 1990 as U.S. Pat. No. 4,893,077 which is in turn a continuation-in-part of U.S. Ser. 07/055,422 filed May 28, 1987 and issued Jan. 9, 1990 as U.S. Pat. No. 4,893,078.

TECHNICAL FIELD

The present invention relates to position sensors in which displacement is indicated by the phase of an electrical signal.

BACKGROUND ART

The shaft angle transducer is a fundamental component in modern control technology. By employing a mechanical coupling mechanism such as a rack and pinion or a spooled band, a shaft angle transducer can monitor linear as well as angular displacement. Linear displacement, however, can also be measured directly by differential or linear variable phase transformers, and ferromagnetic position transducers. See, e.g., Rhod Zimmerman, "Resolvers As Velocity and Position Encoding Devices," PCMI, Sept. 1986, pp. 47-54; Don Overcash, "Selecting the Proper Position Sensor," *Control Engineering*, Sept. 1986, pp. 294-302.

Differential or linear variable phase transformers offer many advantages such as infinite resolution, ruggedness, input/output isolation, and operation over wide temperature ranges. A kind of variable phase transformer sold under the trademark "Inductosyn" is also capable of very high accuracy. As described in Tripp et al. U.S. Pat. No. 2,799,835, this kind of variable phase transformer includes two relatively moveable inductor supports. A first one of the supports carries a pair of first and second windings each in the form of a flat metallic ribbon following a sinuous path along the direction of relative displacement between the two supports. The first and second windings are mounted in positional phase quadrature relation with respect to each other and are excited in electrical phase quadrature by respective sine and cosine signals. The second support carries a third winding similar to the first and second windings. The third winding is also aligned along the direction of relative displacement and is positioned for mutual coupling with the first and second windings. Therefore, the third winding provides an electrical signal having a phase indicating the relative displacement between the supports.

The "Inductosyn," however, must be used as an incremental device for sensing displacements in excess of the wavelength of the windings, because a relative displacement of one wavelength between the two supports results in the same phase indication. For some other kinds of position sensing variable phase transformers, attempts have been made to obtain accurate absolute position sensing over a relatively wide range. Pauwels et al. U.S. Pat. No. 4,282,485, for example, discloses a linear variable phase transformer employing multi-layer helical coils in which the sine and cosine driven windings have a density of windings which is a sinusoidal function of position along the length of the transformer. Shimizu et al. U.S. Pat. No. 4,604,575 discloses a rotational position detection system including a first rotary variable phase transformer detecting an absolute rotational position within a complete circumference, a second rotary variable phase transformer detecting absolute rotational position within an integral submultiple of a complete circumference, and means for combining the positions detected by the two transformers to obtain an indication of absolute rotational position.

DISCLOSURE OF INVENTION

Accordingly, the primary object of the present invention is to provide an absolute position sensor which indicates displacement over a wide range while obtaining the accuracy of an incremental position sensor.

A specific object of the present invention is to provide an "Inductosyn" type of variable phase transformer with absolute position sensing along its entire length.

Another object of the invention is to provide a low-cost absolute position sensor of high accuracy for use in a microcomputer system.

Still another object of the invention is to provide a high-precision position sensor which is easily assembled into a pneumatic or hydraulic cylinder.

For enabling a resolver to have absolute position sensing over a wide displacement range while still obtaining the resolution, accuracy and precision obtainable by operation in an incremental mode, the resolver is provided with a number of terminals for providing offset pitch phase indications as a function of position. A microcomputer is programmed to execute a decoding procedure for reading the offset pitch phase indications and from them computing the absolute position. This method is applicable to linear as well as rotary position sensing. By using multiplexing, digital signal processing and large-scale circuit integration for interfacing the resolver to the microcomputer, the method can achieve absolute position sensing with high reliability and low cost. The offset pitch phase indications are readily provided by inductive coupling between a multiplicity of windings, including a set of offset pitch windings connected to the terminals. A phase indicating signal is picked up using either a relatively moving pick-up device or a stationary coil linked by a ferromagnetic core. A radio-frequency powered modulator is provided for wireless transmission of the phase indicating signal from the moving pick-up device. The offset pitch windings are formed by photolithography on a plurality of laminations or layers, or by winding coils in proper registration, for example, on a multi-layer, multi-pitch coil form.

BRIEF DESCRIPTION OF DRAWINGS

Other objects and advantages of the invention will become apparent upon reading the following detailed description and upon reference to the drawings in which:

FIG. 1, labeled "PRIOR ART," is a diagram showing the three windings in a linear "Inductosyn" type of variable phase transformer;

FIG. 2 is a diagram showing offset pitch phase patterns used in a linear position sensor according to the present invention;

FIG. 3 is a graph showing the phase as a function of displacement sensed from each of the three phase patterns of FIG. 1;

FIG. 4 is a plan view of a linear position sensor employing the present invention;

FIG. 5 is a side view of the position sensor of FIG. 4;

FIG. 6 is an end view in section along line 6—6 in FIG. 5;

FIG. 7 shows the slider used in the position sensor of FIGS. 4–6;

FIG. 8 is an underside view of pick-up coils in the slider of FIG. 7;

FIG. 28 is a schematic diagram of an oscillator which uses the inductance of the periodic windings in the position sensor as the inductance for its resonate circuit;

FIG. 29 is a schematic diagram of an alternative modulator having a pick-up winding in which a radiofrequency signal for wireless transmission is coupled as a common-mode signal and the phase-indicating signal is coupled as a differential signal;

FIG. 30 is an axial view of a ferromagnetic pole-piece assembly for the pick-up coil of FIG. 25;

FIG. 31 is a plan view of a single lamination of the pole-piece assembly of FIG. 30;

FIG. 32 is a section view of the pole-piece assembly of FIG. 30 along section line 32—32;

FIG. 33 is an isometric view of an encapsulated modulator using the pole-piece assembly of FIG. 30;

FIG. 34 is a side view of the encapsulated modulator of FIG. 30 which further shows the internal positions of the modulator components;

FIG. 43 shows a balanced second-harmonic modulator employing a pair of parallel-connected directional diodes;

FIG. 44 is a timing diagram illustrating the operation of the balanced second-harmonic modulator of FIG. 43;

FIG. 45 is a schematic diagram showing a balanced second-harmonic modulator using a pair of transistors to provide conversion gain;

FIG. 46 is a schematic diagram showing a balanced second-harmonic modulator using an operational amplifier;

FIG. 47 is a schematic diagram of a passive harmonic modulator sensor element using a saturable ferromagnetic material; and FIG. 48 is a schematic diagram of a synchronous detector for detecting the second harmonic produced by the secondharmonic modulator of FIG. 43, 45, 46, or 47.

Figure 9:
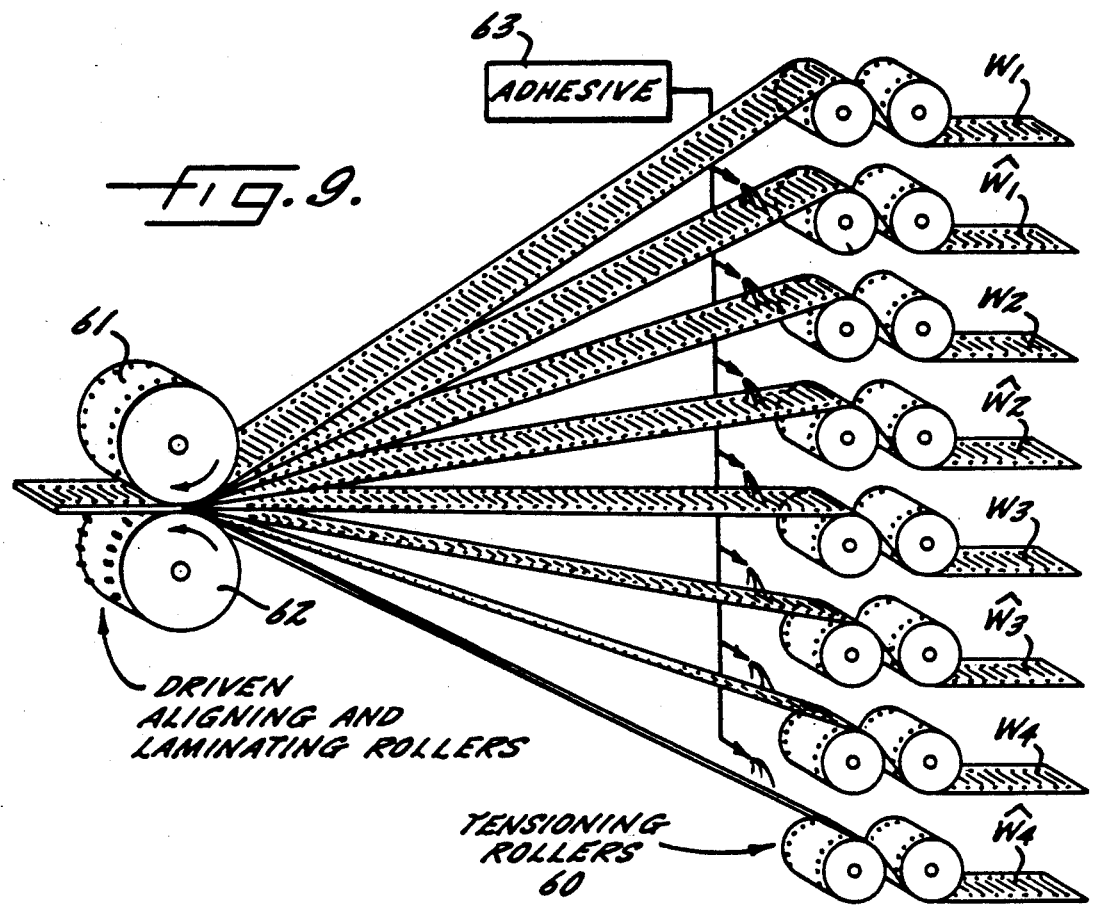
FIG. 9 is a diagram showing a process for laminating together a multiplicity of offset pitch flat sinuous windings in phase registration with each other.

While the invention is susceptible to various modifications and alternative forms, specific embodiments thereof have been shown by way of example and will be further described in detail. It should be understood, however, that it is not intended to limit the invention to the particular forms disclosed, but, on the contrary, the intention is to cover all modifications, equivalents, and alternatives falling within the spirit and scope of the invention as defined by the appended claims.

MODES FOR CARRYING OUT THE INVENTION

Turning now to the drawings, there is shown in FIG. 1 a schematic diagram of an "Inductosyn" type of variable phase transformer 20 for sensing linear displacement. The variable phase transformer 20 includes a first inductor support 21 and a second inductor support 22 which are moveable relative to each other along an axial direction 23. The first support 21 carries a pair of windings $W_1$ and $\hat{W}_1$ each in the form of a flat metallic ribbon following a sinuous path along the axial direction 23. The windings $W_1$ and $\hat{W}_1$ are mounted in positional phase quadrature relation with respect to each other and are driven by respective cosine and sine signals. (Sometimes, however, these kind of resolvers use three-phase driven windings instead of two-phase driven windings.) The second support 22 carries a third winding $W_s$ similar to the first and second windings $W_1$ and $\hat{W}_1$. The third winding is also aligned along the axial direction and is positioned for mutual coupling with the first and second windings. Therefore, the third winding $W_s$ provides an electrical signal having a phase $\theta_d$ indicating the relative displacement between the two supports 21, 22. The electrical signal from the third winding, however, only gives an incremental indication of displacements between the two supports in excess of one wavelength $\lambda$ of the windings, because a relative displacement of one wavelength between the two supports results in the same phase indication. In other words, for the variable-phase transformer 20, the first and second windings $W_1$ and $\hat{W}_1$ comprise a set or pair of windings, each winding in the set being disposed in a periodic spatial pattern having the same pitch or wavelength $\lambda_1$ and extending over a distance or range including multiple cycles. When used in connection with the third winding $W_s$, the windings $W_1$ and $\hat{W}_1$ permit an electrical signal $\cos(wt + \theta_d)$ to be generated having a phase $\theta_d$ proportional to the relative displacement between the two supports 21, 22. The phase $\theta_d$ itself is a periodic function of the relative displacement over a range of displacement corresponding to the distance or range over which the set or pair of periodic windings $W_1$ and $\hat{W}_1$ extend. In particular, the phase $\theta_d$ as a function of the relative displacement varies continuously over a range of at least two pi ($2\pi$) radians and is periodic with the same wavelength $\lambda_1$ as the first and second windings $W_1$ and $\hat{W}_1$. The set or pair of periodic windings can therefore be considered as defining a phase pattern ($P_1$ in FIG. 2) giving rise to a phase $\theta_d$ that is a corresponding periodic function of the relative displacement between the two supports 21, 22.

In accordance with an important aspect of the present invention, the phase ambiguity of the "Inductosyn" type of position sensor is resolved by providing additional sets of periodic windings, each set of windings defining a respective offset pitch pattern (for example patterns $P_2$ and $P_3$ in FIG. 2) having a different respective pitch or wavelength (for example $\lambda_2$ or $\lambda_3$ in FIG. 2). If the support 21 is longer than the support 22, the respective offset pitch phase patterns are most easily established by placing additional pairs of driven windings on the support 21, with each pair of driven windings having a different wavelength. Alternatively, if the support 21 is shorter than the support 22, the offset pitch phase patterns are most easily established by providing multiple pick-up windings on the support 22, with each pick-up winding being similar to the windings $W_1$ and $\hat{W}_1$ but having a different pitch or wavelength. The alternative method requires fewer windings, but in such a case the pick-up windings extend over a greater distance and are therefore more susceptible to noise pick-up. Consequently, for most applications, it is preferable to use a support 22 that is smaller than the support 21 as shown in FIG. 1, and to practice the invention by providing multiple pairs of driven windings on the support 21.

Turning now to FIG. 2, there is shown a schematic diagram of three phase patterns $P_1$, $P_2$, $P_3$ having different respective wavelengths $\lambda_1$, $\lambda_2$, and $\lambda_3$. In addition, each phase pattern extends over a distance including multiple wavelengths. In FIG. 2 the second wavelength $\lambda_2$ is 4/3 of the first wavelength $\lambda_1$ and the third wavelength $\lambda_3$ is 16/15 of the first wavelength $\lambda_1$.

In accordance with an important aspect of the present invention, the phase patterns have respective wavelengths which are about the same but are offset from each other, preferably according to:

$$N_1|\lambda_2 - \lambda_1| = \lambda_1$$
$$N_2 N_1 |\lambda_3 - \lambda_1| = \lambda_1$$
$$\ldots\ldots\ldots\ldots\ldots\ldots$$
$$N_{M-1}\ldots N_2 N_1 |\lambda_M - \lambda_1| = \lambda_1$$

where $N_1, N_2, \ldots, N_{(M-1)}$ are integers. These relationships readily permit the phase pattern $P_2$ to provide absolute position sensing over $N_1$ wavelengths $\lambda_1$, the phase pattern $P_3$ to provide absolute position sensing over $N_2 N_1$ wavelengths $\lambda_1$, and so on. To facilitate the use of binary arithmetic, preferably the N's are powers of two, for example, four, eight or sixteen. The phase patterns in FIG. 2 correspond to N's equal to four. As further described below, the maximum values that can be selected for the N's are determined by the precision of the phase measurements.

In accordance with another aspect of the present invention, an absolute position measurement is made by successively obtaining respective phase measurements for each of the phase patterns, and applying a decoding procedure. The respective phase measurements are obtained by operating an electronic multiplexer which selects the respective set of driven windings or the respective pick-up winding for the respective phase pattern. For using binary arithmetic in the decoding procedure, the phase measurements are preferably made so that a range of 0 to 360 degrees is represented by an unsigned binary number from 0 to one minus an integral power of two, for example, from 0 to 255 representable with eight binary bits.

Turning now to FIG. 3, there is shown a graph of the normalized value or count C obtained as a function of displacement from the null position for each of the phase patterns in FIG. 2. In order to apply a decoding procedure shown and described below in connection with FIGS. 20 and 21, the measured phase values are normalized, by subtracting predetermined constant phase offsets if necessary, to obtain a zero phase value or count C at a central null or zero position. The offsets in the pitch of the respective phase patterns is evident from the differences between the respective slopes for the phase patterns. Each phase pattern has the same phase value at a multitude of different displacement values. Each displacement value, however, has associated with it a unique set of three respective phase values for the phase patterns. Therefore, a decoding procedure can determine the absolute displacement from the three respective phase values measured for any given displacement within the displacement range in FIG. 3.

Turning now to FIGS. 4 to 6, there is shown a linear position sensor employing the present invention. The sensor is housed in an extruded aluminum rail 30. An elongated support 31 for a plurality of pairs of driven windings ($\phi_1$, $\bar{\phi}_1$, $\phi_2$, $\bar{\phi}_2$, $\phi_3$, $\bar{\phi}_3$) is secured in the bottom of the rail 30 by set screws 32. Preferably the support is an insulating material such as glass fiber reinforced plastic. For high accuracy, ferromagnetic materials are typically not used, but if high accuracy is not of prime importance, the substrate can be loaded with iron or ferrite powder to increase the magnetic coupling between the driven windings and the pick-up winding and thereby provide an increased output signal level. The driven windings 32 are laminated or wound onto the substrate 31, as shown and further described below in connection with FIGS. 9-11.

A pick-up winding is carried by a slider 33 which slides over the substrate 31. To position the slider, a control bracket 34 is fastened to the slider 33. The control bracket protrudes above the rail 30 for connection as a follower to whatever is providing the displacement to be sensed. A pair of rubber or plastic seals 35, 36 cover the top of the rail 30 and join forming an elongated slit through which the control bracket slides. In order to provide a connection between the pick-up winding in the slider 33 and a shielded twisted pair 37 mounted to the end portion 40 of the rail 30, a pair of resilient bands 38, 39 connect the control bracket 34 to the end portion 40 of the rail. The band 38 carries electrical conductors conveying the pick-up signal. Preferably the resilient bands are Mylar strips, and the electrical conductors are copper foil strips adhesively bonded or laminated into the resilient band 38.

The control bracket 34 and slider 33 are further shown in FIG. 7. Preferably the control bracket is made of sheet brass that is cut, bent to shape and spot welded together at 41. Holes 42 are provided for riviting the control bracket 34 to the resilient bands 38, 39. To urge the slider into contact with the substrate 31, resilient fingers 43 are formed in the control bracket.

Shown in FIG. 8 are pick-up coils 50, 51, 52 in the bottom of the slider 33. The slider 33 is made of plastic and can be loaded with iron or ferrite powder to increase the coupling of the pick-up coils with the driven windings. The coils are rectangular multi-turn pancake coils that are slightly skewed to improve the linearity of the phase with respect to displacement. The coils are spaced one-half wavelength from each other, and the middle coil 51 is connected in opposite polarity with respect to the end coils 50, 52. To reduce noise and distortion caused by capacitive coupling to the coils 50, 51, 52, an electrostatic shield 53 in the form of a comb is laid over the coils. The electrostatic shield is connected to the ground lead or shield wires of the electrical conductors 37 conveying the pick-up signal.

Turning now to FIG. 9, there is shown a schematic diagram of a machine for aligning and laminating multiple driven windings in precise phase registration with each other. Perforated plasic film of the kind used for motion picture film is laminated to copper foil and the windings of the required wavelengths are etched in the copper foil in the required registration with the perforations by using printed circuit or photolithographic techniques. The films carrying the various windings are conveyed over tensioning rollers 60 to a pair of driven laminating rollers 61 and 62. The rollers are sprocketed to maintain proper registration between the film layers. Before reaching the laminating rollers, the films receive adhesive 63 for bonding the films together.

Figure 10:
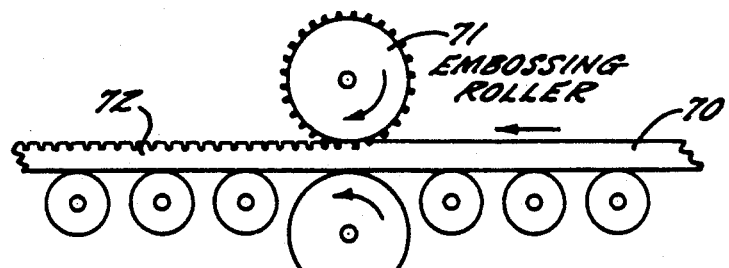
FIG. 10 is a diagram showing a ferromagnetic substrate being embossed with slots for aligning lap windings.

Driven windings can also be wound rather than laminated on the substrate. Winding by hand is facilitated by the use of a substrate having closely spaced slots for receiving the windings. As shown in FIG. 10, an embossing roller 71 can be used to emboss a plastic strip 70 to provide the slots 72. The embossing could also be done during an extrusion process. Preferably the plastic strip 70 is loaded with iron or ferrite powder to increase the coupling between the driven windings and the pick-up winding.

Figure 11:
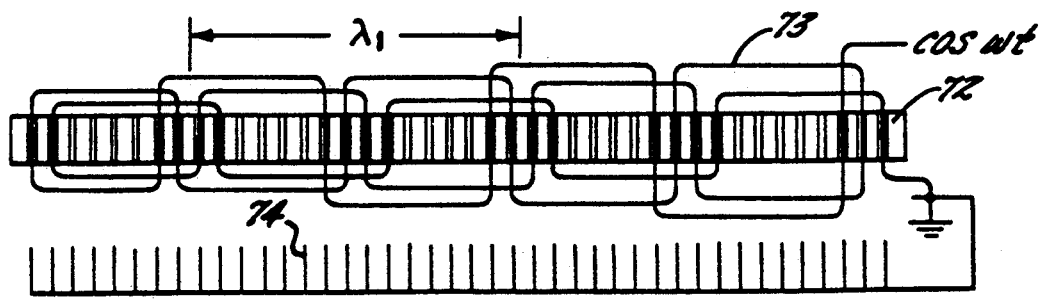
FIG. 11 is a diagram showing one lap winding on a slotted ferromagnetic substrate, and an electrostatic shield in the form of a comb.

The winding of a driven winding 73 on the slotted substrate 72 is shown in FIG. 11. The first wavelength $\lambda_1$ is chosen to have an integral number of slots, such as 16 as shown. The positions of the other windings are quantized by the positions of the slots. This quantization introduces some phase non-linearity in the response from the other windings. The phase non-linearity may necessitate the use of an additional pair of driven windings. Preferably the uppermost winding in each slot of the substrate is covered by a wire from an electrostatic shield 74 in the form of a comb.

The use of a slotted substrate comprising iron or ferrite powder considerably increases the degree of coupling between the driven windings and the pick-up winding. To eliminate the need for an electrical connection to the pick-up coil, a micropower FM transmitter could be energized solely by the signal received by the pick-up winding from the driven windings. The use of such a transmitter is shown in FIGS. 12-13.

Figure 12:
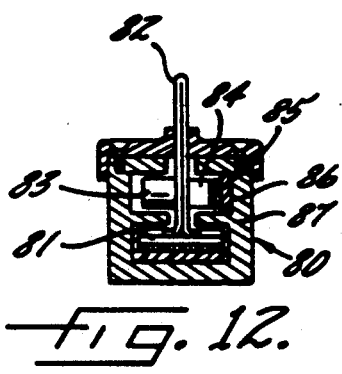
FIG. 12 is a side view corresponding to FIG. 6 but showing a strip transmission line rather than a flexed resilient ribbon returning the phase signal from the pickup head.

As shown in FIG. 12, a linear position sensor 80 similar to that shown in FIGS. 4-6 is provided with a slider 81 mounted to a control bracket 82. A micropower FM transmitter 83 and a sliding capacitor 84 are also mounted to the control bracket 82. The sliding capacitor 84 capacitively couples the output of the FM transmitter 83 to a strip transmission line comprising a plastic strip 86 mounted to the rail 87 of the position sensor 80, and a strip of copper foil 85 adhesively bonded to the plastic strip 86. The strip transmission line extends along the length of the rail 86.

Figure 13:
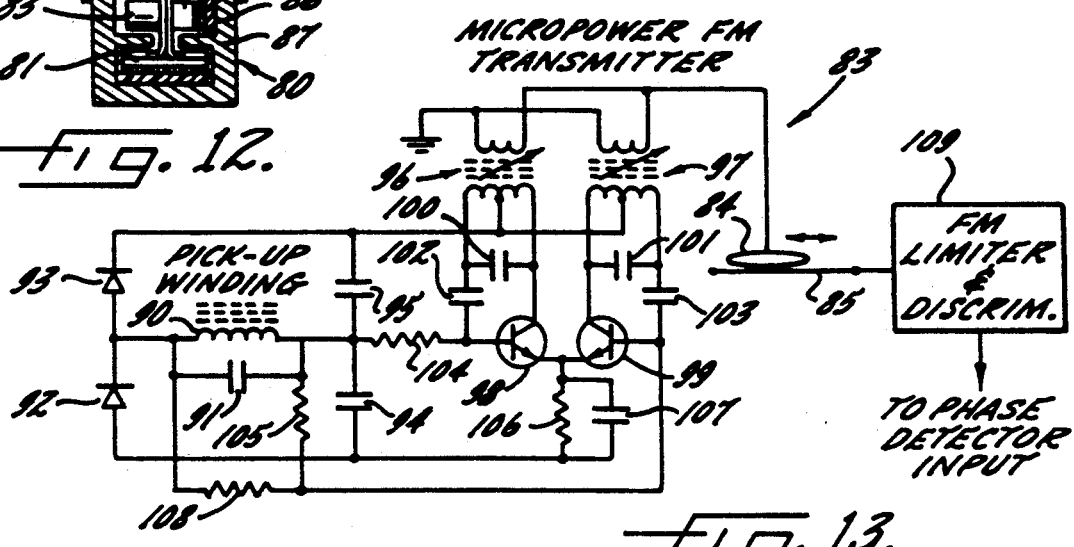
FIG. 13 is a schematic diagram of a micropower frequency-shift-keyed transmitter for generating a return signal for transmission over the strip transmission line of FIG. 12.

A schematic diagram of the micro-power FM transmitter 83 is shown in FIG. 13. A signal at about 20 KHz is received by the pick-up coil 90 which is tuned to the frequency of the signal by a capacitor 91. The received signal is rectified by a full wave doubler circuit including a pair of germanium crystal diodes 92, 93 and a pair of capacitors 94, 95. The rectified signal powers a selected one of two transistor oscillators having respective tuned circuits 96, 97 which are adjusted to different frequencies. The transistor oscillators also include respective transistors 98, 99, resonating capacitors 100, 101, feedback capacitors 102, 103, and biasing resistors 104, 105.

So that a particular one of the transistor oscillators are selected for oscillation in response to the polarity of the signal across the pick-up coil 90, the transistors 98, 99 share a common emitter resistor 106 and RF bypass capacitor 107 so as to form a differential pair and function as a differential amplifier at the 20 KHz frequency. The signal across the pick-up coil 90 is fed to the transistor 99 through a resistor 108, causing conduction to periodically switch from one transistor to the other, and therefore causing the frequency of oscillation to periodically shift from the frequency of one transistor oscillator to the other. The frequencies of oscillation, for example, are slightly above and below the standard FM intermediate frequency of 10.7 MHz so that a standard FM limiter and discriminator 109 may be used to detect the FM modulated signal. The limiter and discriminator is, for example, an integrated circuit such as RCA Corporation part No. CA3075. The limiter and discriminator receives the signal from one end of the strip transmission line 85.

Figure 14:
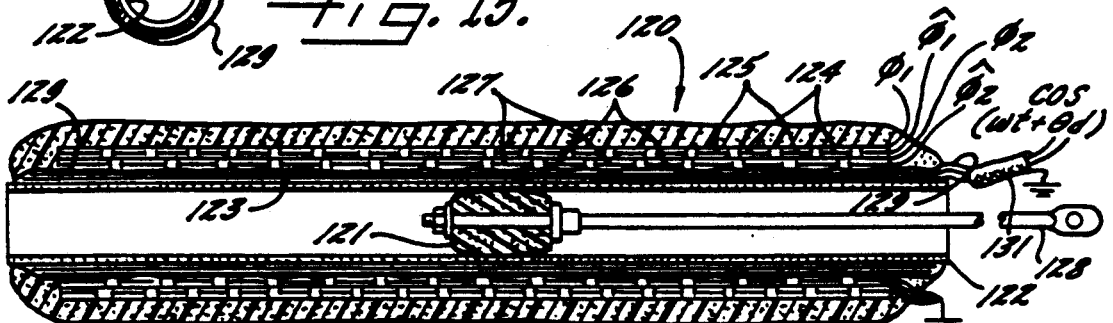
FIG. 14 is a longitudinal cross-sectional view of an alternative embodiment of a linear position sensor of the present invention employing helical windings.

Turning now to FIG. 14, there is shown a longitudinal cross-sectional view of an alternative embodiment 120 of a linear position sensor of the present invention employing helical windings. The linear position sensor 120 has the advantage that the sense winding and the driven windings are relatively fixed with respect to each other so that flexible electrical connections or other means are not required for communicating signals from the relatively moving windings. Instead of relatively displacing the pick-up winding with respect to the driven windings to obtain a phase signal indicating displacement, a displaceable ferromagnetic core 121 magnetically couples the driven windings and the pick-up winding in such a way that the pick-up winding receives a signal having a phase indicating displacement of the core 121.

As shown in FIG. 14, the core 121 is disposed inside a tube 122 upon which are wound a two-layer pick-up winding 123 and offset pitch driven windings 124, 125, 126, and 127 for the respective phases $\phi_1$, $\bar{\phi}_1$, $\phi_2$, $\bar{\phi}_2$. For displacing the core 121, it is secured to the end of a rod 128. In order to eliminate electrostatic coupling between the pick-up winding 123 and the driven windings 124, 125, 126, 127, an electrostatic shield 129 in the form of a layer of metal foil is wound on the pick-up winding, and the driven windings are wound over the shield.

Figure 15:
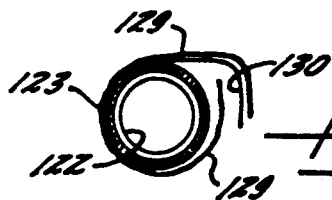
FIG. 15 is an axial view of the position sensor of FIG. 14 during assembly of an electrostatic shield between the driven windings and the pick-up winding.

As shown in FIG. 15, the shield 129 is wound over the pick-up winding 123 with overlapping portions separated by an insulating layer 130. The shield 129, for example, is a strip of aluminum foil, and the insulating layer is a strip of adhesive tape. This form of construction permits magnetic flux at the operating frequency to pass from the driven windings to the pick-up winding, while attenuating higher frequency noise and harmonic distortion.

Returning for a moment to FIG. 14, the shield 129 is preferably connected to the shield 131 of a shielded twisted pair for conveying the signal received by the pick-up winding 123. Preferably all of the windings are magnetically shielded by an external magnetic shield 132 which also improves the coupling between the driven windings and the pick-up windings. As shown in FIG. 14, the magnetic shield is made of epoxy resin loaded with ferrite powder. The ferrite powder is mixed with epoxy glue, and the mixture is painted on the windings so that it hardens over the windings. In FIG. 14 the thickness of the windings has been exaggerated for the sake of illustration. The tube 121 as well as the windings should be thin so as to provide a short air gap between the core 121 and the shield 132 so as to maximize the magnetic coupling between the pick-up winding and the driven windings via the core. The core 121, for example, has a length of 10 mm, and a diameter of 5.4 mm. The coils are wound with 0.125 mm diameter wire, giving 8 turns per mm. The driven windings extend over 80 mm, or four wavelengths of 20 mm per wavelength. The two layer pick-up winding extends over 90 mm. With these dimensions and at an operating frequency of 15.625 kHz, the pick-up winding resonated with a 0.08 uF capacitor and therefore had an impedance of about 130 ohms.

Figure 16:
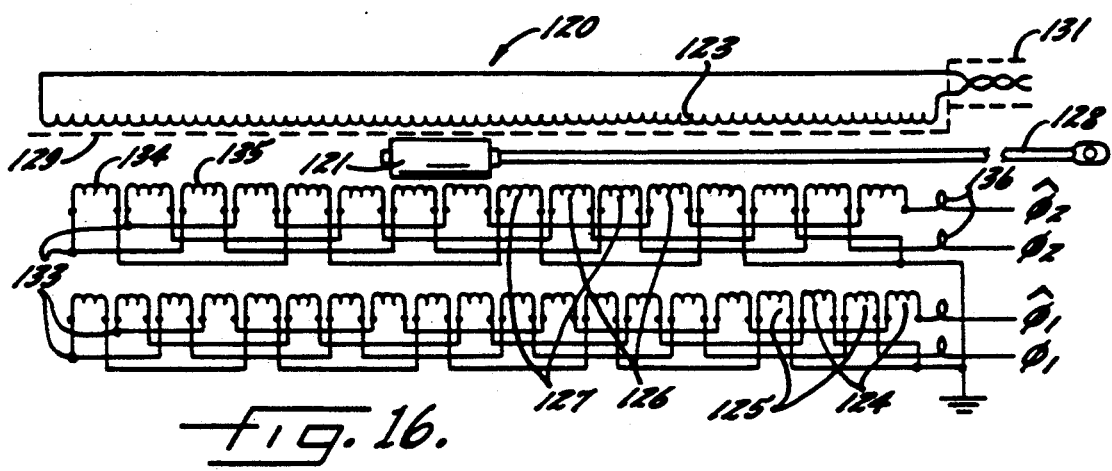
FIG. 16 is a schematic diagram of the linear position sensor of FIG. 14.

The electrical connections for the windings of the sensor 120 are shown in FIG. 16. Each of the windings is formed of a continuous length of wire, but each of the driven windings 124, 125, 126, 127 has a number of sections that are about a quarter wavelength long. Also, adjacent quarter wave sections are wound with opposite sense. Preferably this is done by winding one half of each driven winding in a clockwise direction, and winding the other half in a counter-clockwise direction. The direction changes, for example, at the nodes 133, and the quarter wave section 134 is wound clockwise and the quarter wave section 135 is wound counter-clockwise.

If the length of the core 121 is very short in comparison to the length of the windings, there may be substantial unbalanced parasitic magnetic coupling between the driven windings and the pick-up winding. In this case it is advisable to null out the imbalance of each driven winding by winding a few additional turns 136 as needed. These additional turns are wound by hand while the respective driven winding is energized at the operating frequency and the signal in the pick-up winding is measured, in order to null out the measured signal.

Figure 17:
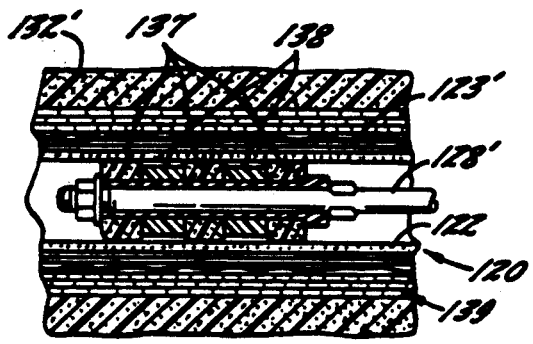
FIG. 17 is a longitudinal cross-sectional view corresponding to FIG. 14 but showing a ferromagnetic coupling member including a plurality of ferromagnetic rings offset from each other by about one wavelength.

For the sensor 120 of FIG. 14, the core 121 is about a half wavelength long, and the windings are about four wavelengths long. If the sensor is to be longer than this, it is advisable to use a segmented core having a number of magnetically permeable half-wavelength sections centered at wavelength intervals, as shown in FIG. 17. In the sensor 120', the core 121' includes three ferromagnetic sections 137 separated by half-wavelength spacers 138. The sensor 120' has a two-layer pick-up winding and driven windings 139 for six phases. It should be noted that the thickness of the windings in FIG. 17 has been exaggerated for the sake of illustration.

It should apparent that the technique of using a ferromagnetic slider to couple relatively fixed driven and pick-up windings can be used with the laminated or slot-wound windings, and in such cases an electrostatic shield in the form of a grounded comb should be laminated or interlaid between the driven windings and the pick-up winding. The helical winding geometry, however, provides relatively high mutual inductance between the driven windings and the pick-up windings, and relatively low self-inductance, so that it functions most like a transformer, and returns a high signal level. The slot-wound geometry may return a high signal level but has appreciable self-inductance which may have to be cancelled out by selecting resonating capacitors for shunting the windings, but drift in the capacitance or self-inductance values causes a phase shift and therefore some loss in precision of position measurement. The laminated windings provide low self-inductance but also low mutual inductance, so high accuracy can be obtained, but relatively high drive current and a preamplifier near the position sensor may be required to obtain a sufficiently high signal to noise ratio for repeatable measurements within the high resolution of the digital phase sensing provided with the circuitry described below in connection with FIGS. 23 and 24.

Figure 18:
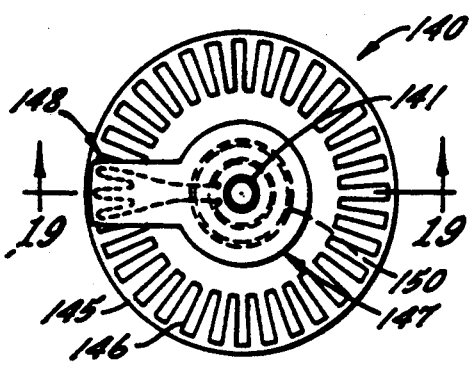
FIG. 18 is a plan view of an angular position sensor employing the present invention.
Figure 19:
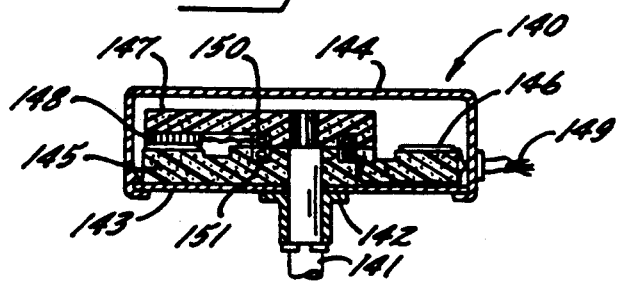
FIG. 19 is a side view, in cross section along line 19—19 in FIG. 18, of the angular position sensor mounted in a protective housing.

Turning now to FIGS. 18 and 19 there is shown a rotary position sensor 140 employing the present invention. As is conventional, the sensor 140 has a control shaft 141 journaled to a mounting bushing 142 which is affixed to a disc-shaped plate 143. A cover 144 fits onto the plate 143.

To sense the angular position of the control shaft 141 with respect to the plate 143, a field member 145 formed of ferrite-loaded plastic is secured to the plate 143, and an armature member 147, also formed of ferrite-loaded plastic, abuts the field member and is secured to the control shaft. Multi-phase driven windings are provided on an annular-shaped multi-layer printed circuit board 146 mounted on the annular face of the field member 145. To give a phase-linear response over an entire 360 degrees of angular position, the driven windings should have an integral number of wavelengths per 360 degrees, for example, a first pair of driven windings have 16 wavelengths per 360 degrees, a second pair of driven windings has 12 wavelengths per 360 degrees, and a third pair of driven windings has 15 wavelengths per 360 degrees, corresponding to the example in FIG. 3. To sense the phase of the magnetic field provided by the driven windings at a selected angular position, the armature member is formed with grooves into which are wound pick-up windings 148 which abut the printed circuit board 146. The pick-up windings 148 are similar to the pick-up windings 50-52 of FIG. 8.

In order to convey the signal from the pick-up windings 148 to external lead wires 149, the pick-up windings are connected to an annular coil 150 formed in the armature member 147, and two of the lead wires 149 are connected to an annular coil 151 formed in the field member 145. The annular coils 150, 151 therefore form a rotary transformer. The other lead wires are connected to the driven windings in the printed circuit board 146.

Figure 20:
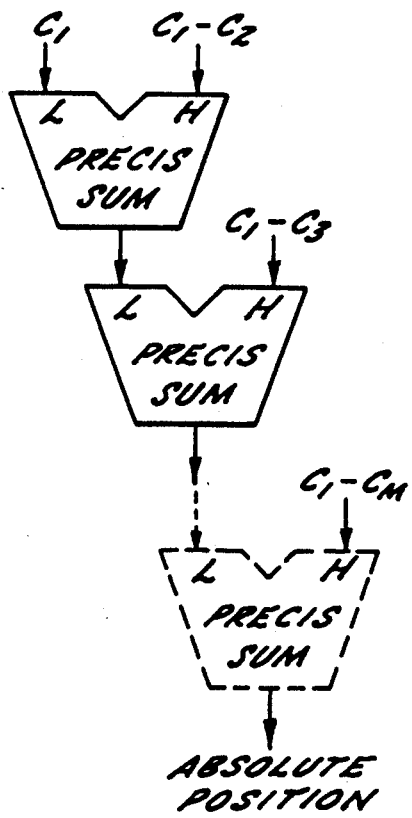
FIG. 20 is a flow diagram of a computer procedure which combines phase signals from offset pitch phase patterns to determine absolute position.

There has now been described linear and rotary position sensors for generating electrical signals which provide respective offset pitch phase indications $C_1, C_2, \ldots C_M$ of displacement. In accordance with a feature of the present invention, the offset pitch phase indications are combined to form a position value by successively employing a procedure for justifying a high and low precision value and combining them. A specific procedure, named "PRECIS", is included in the program listing of Appendix I. The procedure is used as shown in FIG. 20. The indication $C_1$ approximately gives the least significant portion of the absolute position, $N_1$ times the difference $C_1-C_2$ gives the next least significant portion of the absolute position plus about $C_1$, and so on, and $N_1*N_2*\ldots*N_{M-1}$ times the difference $C_1-C_M$ gives approximately the absolute position. The various portions can be computed with precision by truncation, and then combined by multiplication and addition, but before truncation the fraction of the prior subtotal representing the less significant portions should be subtracted and one-half of the truncation quantization should be added. Therefore, the absolute position is given by:

$$C_1 + N_1*TRUN(C_1 - C_2 - ST_1/N_1 + HQ_1) +$$

$$N_1*N_2*TRUN(C_1 - C_3 - ST_2/N_2 + HQ_2) + \ldots +$$

$$N_1*N_2* \ldots *N_{M-1}TRUN(C_1 - C_M - ST_{M-1}/N_{M-1} + HQ_{M-1})$$

where $ST_1=C_1$, $ST_2=ST_1+N_1*TRUN(C_1-C_2-ST_1+HQ_1)$, etc.

The procedure PRECIS in effect performs the elementary operation $L+N*TRUN(H-L/N+HQ)$.

Figure 21:
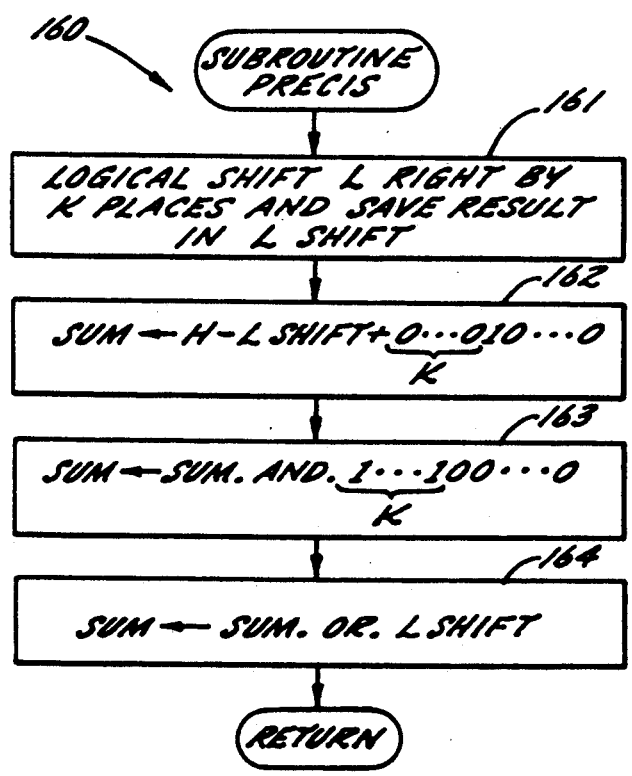
FIG. 21 is a flowchart of a subroutine used in the procedure of FIG. 20 to justify a lower-order set of binary bits with a higher-order set of binary bits and then combine them to form a binary number indicating position.

Turning now to FIG. 21, there is shown a flowchart 160 of the PRECIS procedure implemented in binary arithmetic. It is assumed that the N's are powers of 2, such that $N=2^K$. In the first step 161 the operand L is left shifted right by K places to perform a division by N. Then in step 162, the left-shifted operand L is subtracted from H and a half-quantization value of $0\ldots 010\ldots 0$ is added in order to compute $H-L/N+HQ$. In step 163 the sum is truncated by logically anding the sum with the mask $1\ldots 100\ldots 0$. Finally, in step 164, the sum is logically or'ed with the left-shifted operand L, to obtain a left-justified value of $L+N*TRUN(H-L/N+HQ)$.

As an example, suppose $M=2$ so that there are two phase counts $C_1$ and $C_2$, and further assume that $C_1$ and $C_2$ are measured with eight bit precision, and the absolute position is 010001001101 binary. If the counts were entirely accurate, then one would measure $L=C=01001101$ and $H=C_1-C_2=01000101$. In step 161 the left-shifted value of L is 000001001101, and in step 162 the sum is computed as $010001000000-000001001101+000010000000=01001\text{-}0000011$. In step 162 the sum is truncated to 010000000000 and in step 163 the sum becomes 010001001101 as it should be. However, even if the value of H were as high as 01001100 or as low as 00111101 the procedure would give the correct absolute position. Therefore, so long as the differences between the phase counts have four bit precision (i.e., an eight-bit count is precise to within $+00000111$ and $-00001000$ relative to the count $C_1$), then the absolute position can be resolved to within four additional bits by the sensing of an additional phase count.

Figure 22:
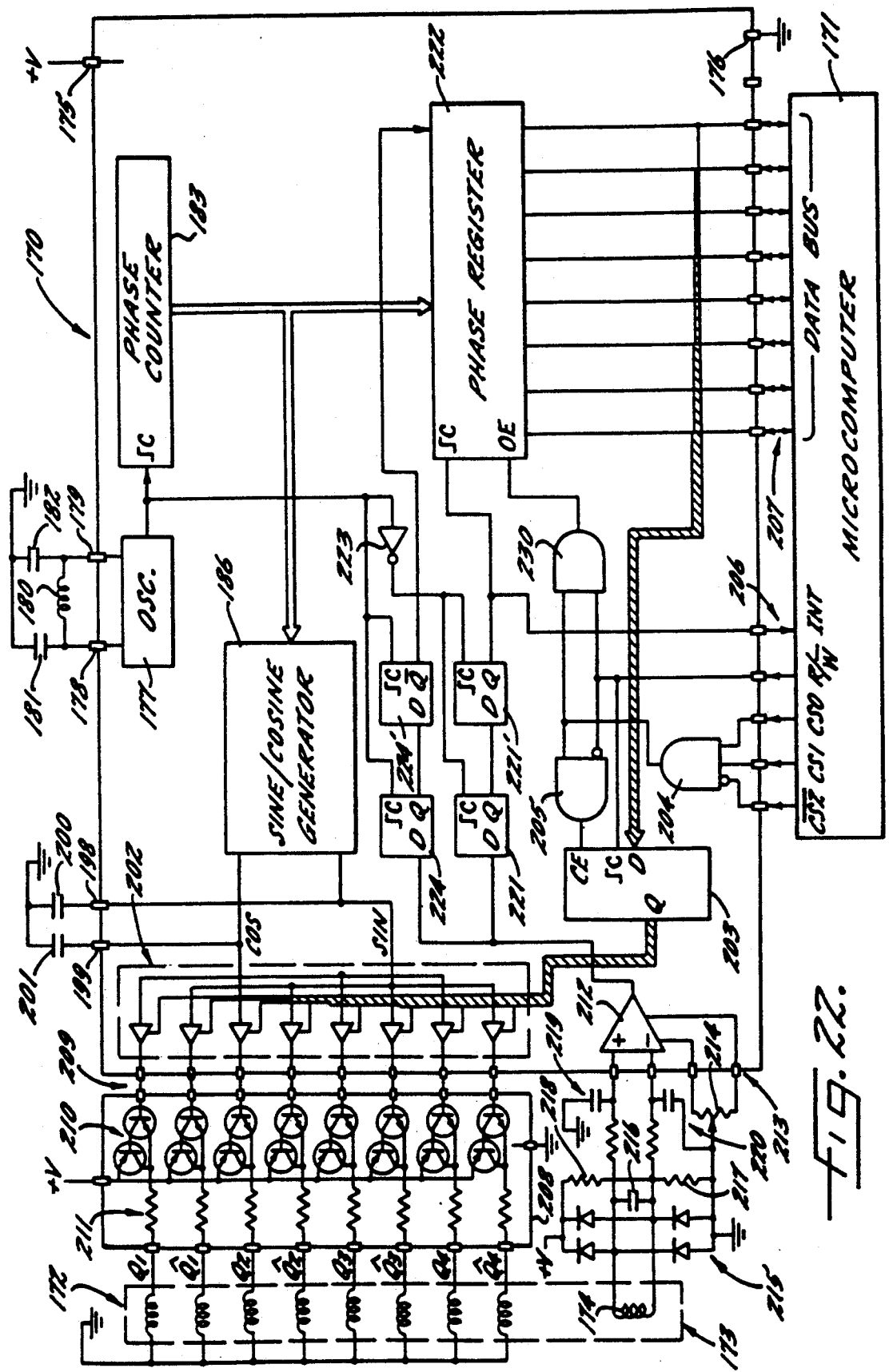
FIG. 22 is a block diagram of an integrated circuit for interfacing the absolute position sensors of the present invention to a microcomputer.

Turning now to FIG. 22, there is shown an integrated circuit 170 for use with a conventional microcomputer 171 for energizing the driven windings 172 of a position sensor 173 of the present invention and for processing the signal from a pick-up winding 174 to obtain phase counts. As shown, the integrated circuit 170 has 32 pins, and it is preferably fabricated using a CMOS process. Pin 175 receives a power supply voltage such as 5 volts, and pin 176 is a ground connection.

To provide a time base for generating quadrature-phase excitation signals for the driven windings 172 and for resolving the relative phase of the signal from the pick-up winding 174, the integrated circuit 170 includes an oscillator 177 having pins 178, 179 for connections to a resonator or tank circuit such as a quartz crystal, ceramic resonator, or as shown, an inductor 180 and capacitors 181 and 182. The oscillator 177 preferably oscillates at about 4 MHz or higher to provide quadrature-phase excitation signals at about 30 kHz or more. The excitation frequency is generated by a seven-stage synchronous binary counter 178.

In order to generate the quadrature-phase excitation signals, the output of the phase counter 183 is fed to a sine/cosine generator 186. The sine and cosine waveforms appear on pins 198, 199 which may be shunted to ground by capacitors 200, 201 in order to suppress switching harmonics and to cancel the effect of inductance in the driven windings 172 so that relatively undistorted sinusoidal waveforms appear across the driven windings.

In order to selectively energize the driven windings 172, the integrated circuit 170 includes respective transmission gates 202 which are enabled by respective signals from a latch 203. The integrated circuit 170 also includes a chip-select gate 204 to enable the microcomputer 171 to address the integrated circuit 170 and a latch-select gate 205 to enable the microcomputer to write to the latch 203 by asserting an address on chip-select and control pins 206 and by passing data over a bidirectional data bus to data bus pins 207.

To provide a sufficient amount of current for driving the driven windings 172 of the position sensor 173, a bipolar integrated circuit 208 is wired between the driven windings and output pins 209 for the transmission gates 202. The integrated circuit 209 includes respective super-beta transistors 210 in emitter follower configuration with respective current limiting resistors 211. To reduce leakage currents in the super-beta transistors 210, the transmission gates 202 should have NMOS devices for shunting the output pins 209 to ground when the transmission gates are off.

For receiving the signal from the pick-up winding 174, the integrated circuit includes a comparator 212 having signal and offset inputs on a set of pins 213. An optional potentiometer 214 may be used to adjust the offset of the comparator, for example, to provide a zero adjustment for the position sensor. Interconnected between the pick-up winding 174 and the comparator 212 is a circuit for biasing and protection from electrostatic discharge and electromagnetic pulse interference, including a bridge 215 of protection diodes clamping the leads of the pick-up windings to between ground and the supply voltage, a capacitor 216 resonating with the inductance of the pick-up coil, biasing resistors 217, 218, and resistor-capacitor lowpass filters 219, 220 protecting each of the inputs of the comparator 212 from high-speed pulses. If the position sensor 172 is mounted in close proximity to the integrated circuit 170, however, it may be unnecessary to use the diode bridge 215 or the resistor-capacitor filters 219, 220.

In order to sense the relative phase of the signal from the pick-up winding 174, the output of the comparator 212 is sampled by a delay flip-flop 221 and used to clock a latch receiving the phase count from the phase counter 183. A second flip-flop 221' is also used to guarantee a fastrising clock to the latch 222 under all signal conditions Therefore, the latch 222 functions as a phase register for indicating the phase of the signal from the pick-up winding 174. To eliminate a critical race condition, the delay flip-flops 221, 221' are clocked by an inverter 223 driven by the oscillator 177.

In order to provide increased phase resolution, the least significant bit of the phase count is provided by sampling the signal from the pick-up winding coincident with a clock transition of opposite polarity to the clock transition coincident with the sampling of the signal from the pick-up winding for the purpose of clocking the phase register 222. By employing this technique, the phase of the signal from the pick-up winding can be resolved with one extra bit of precision without requiring an increase in the frequency of the oscillator 177. In FIG. 22, the least significant bit of the phase count is provided by delay flip-flops 224, 224' clocked by the oscillator 177. Also in FIG. 22 the complement output of the flip-flop 224' is fed to the least significant data input of the phase register 222, and the data output of the flip-flop 221' is fed to the clock input of the phase register which is active upon a rising transition or edge from the flip-flop 221'.

To permit the microcomputer to address and read the phase count from the phase register 222, the phase register has tri-state outputs which are connected to the data bus 207 and which are enabled by a gate 230 when the integrated circuit is addressed and the read/write signal is active for a read operation.

Figure 23:
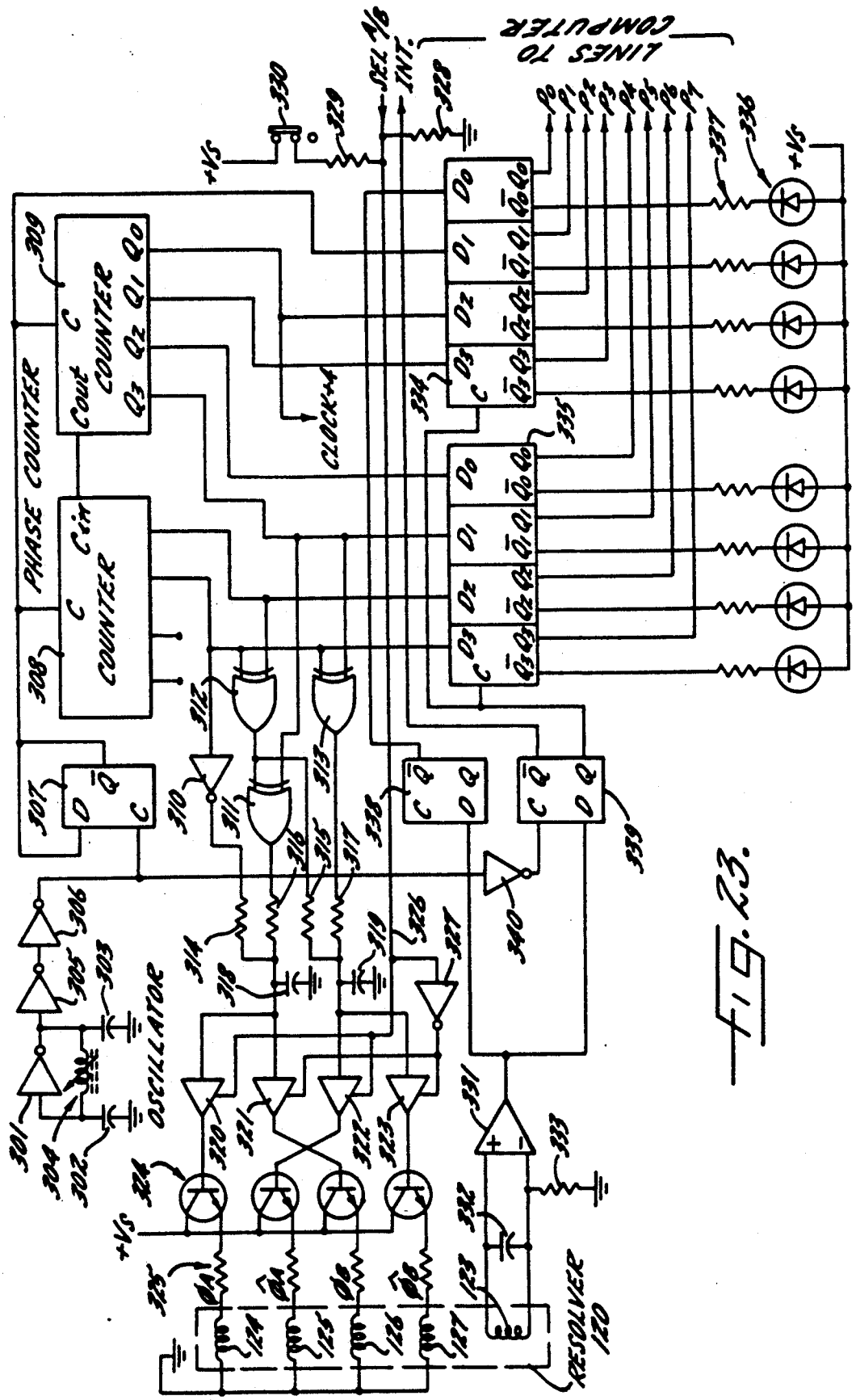
FIG. 23 is a schematic diagram of a circuit for interfacing the position sensor of FIGS. 14–16 to a microcomputer.

Turning now to FIG. 23 there is shown a schematic diagram of a circuit using individual 4000 series CMOS integrated circuits for demonstrating the feasibility of the integrated circuit 170 of FIG. 22 and for operation with a Motorola 6800 microprocessor programmed as shown in Appendix I. A 4 MHz oscillator is provided by an inverter 301, capacitors 302 and 303, and an inductor 304. The inverter is, for example, part no. 4069, the capacitors are 120 picofarad, and the inductor is about 25 microhenries. The output of the inverter is buffered by inverters 305 and 306.

A phase counter includes a binary divider formed by a delay flip-flop 307 (part No. 4013) and 4-bit synchronous counters 308 and 309 (part No. 4029). A delay flip-flop is used because it can clock about twice as fast as a 4-bit synchronous counter (5 MHz for the 4013, but only about 2.5 MHz for the 4029). A quadrature-phase sine-cosine generator is provided by an inverter 310, exclusive-or gates 311, 312, 313 (part No. 4030), resistors 314, 315 (10 K ohm), resistors 316, 317 (22 K ohm), and capacitors 318, 319 (470 picofarads). The quadrature-phase signals are selectively directed through transmission gates 320, 321, 322, and 323 (part No. 4016). To drive the driven windings 124, 125, 126, 127 of the resolver 120 of FIG. 4, there are provided respective emitter follower circuits including NPN bipolar transistors 324 and resistors 325 (150 ohms). The windings 124, 125 are driven when a SEL A/B signal on line 326 is high, and otherwise an inverter 327 enables transmission gates 321 and 323 to drive the windings 126 and 127. To provide both manual as well as computer operation of the demonstration circuit, the line 326 is shunted to ground through a resistor 328 (100 K ohms) and is selectively connectable to the power supply through a resistor 329 (4.7 K ohms) and a switch 330. The switch is effective when the microcomputer is disconnected from the circuits in FIG. 23.

The signal from the pick-up winding 123 is fed to a comparator 331 (e.g. National Semiconductor part No. LM311, RCA Corp. CA311). The leads from the pick-up winding 123 are shunted with a capacitor 332 to resonate with the inductance of the pick-up winding at the operating frequency (for a 4 MHz clock, the operating frequency is 31.25 kHz and a typical capacitance value is 0.015 microfarad). A resistor 333 (22 K ohms) biases the comparator inputs to ground.

Two quad D latches 334, 335 (part No. 74C175) provide a phase register. The phase register has true outputs which are fed to an input port ($P_0$-$P_7$) of the microcomputer, and complement outputs which drive an array 336 of light-emitting diodes connected via current-limiting resistors 337. The least significant input of the phase register is provided by a delay flip-flop 338 (part No. 4013). The phase register is clocked by the output of another delay flip-flop 339 (part no. 4013). An inverter 340 ensures that the two delay flip-flops 338, 339 are clocked alternately by the buffer inverter 306.

The program listing in Appendix I is executed to enable a Motorola 6800 microprocessor to operate the test circuit of FIG. 23. The computer program assumes that the I/0 port $P_0$-$P_7$ is a Motorola 6820 PIA having a control A register at address F009 and corresponding data direction and I/0 registers at address F008. The terminal CRA2 for the PIA is used to supply the SEL A/B signal to line 326 of FIG. 24, and the terminal CRA1 of the PIA is used to receive the complement output of the flip-flop 339 of FIG. 24 as an interrupt signal. Every time that a phase count $C_i$ is clocked into the phase register 334, 335, the microcomputer executes the interrupt procedure MIVEC beginning at address 0400. The interrupt procedure increments an interrupt counter (at address 0200) upon each interrupt. When the interrupt counter reaches a value of six, the count in the phase register 334, 335 is read and stored in memory (at address 0201) as the A phase count and then the SEL A/B signal is switched to select B. When the interrupt counter reaches a value of twelve (C hexadecimal), the interrupt counter is cleared, the count in the phase register is read and stored in memory (at address 0202) as the B phase count and the SEL A/B signal is switched back to select B. Therefore, the microcomputer periodically excites the A driven windings 124, 125; obtains the phase count $C_A$, excites the B driven windings, 126, 127, and obtains the phase count $C_B$.

In the executive program beginning at address 0440, the PIA is set up in a procedure named START. Then the absolute position is computed from the A and B phase counts which are stored and periodically updated in memory at addresses 0201 and 0202, respectively. In the procedure named COMPUTE the difference between the A and B phase counts is computed and stored as a two byte integer number in the memory locations 0204 and 0205 which store the SUM parameter for the PRECIS subroutine. The PRECIS subroutine is called to determine the absolute position, which ends up in the SUM memory locations 0204 and 0205. In a procedure named DISPLAY, the value of the absolute position is displayed by calling an internal subroutine residing in the microcomputer's operating system at address BDFF. Upon returning, execution jumps back to the COMPUTE procedure. In this way the absolute position of the core in the resolver 120 is continuously determined and indicated by the microcomputer.

Figure 24:
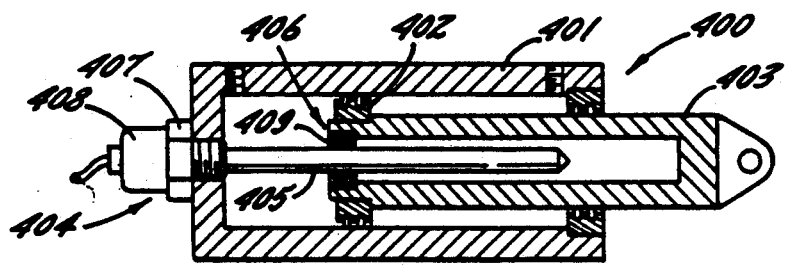
FIG. 24 is a longitudinal section view of a hydraulic cylinder having inserted therein a linear position sensor according to another embodiment of the present invention.

Turning now to FIG. 24, there is shown a longitudinal cross-sectional view of a piston and cylinder assembly 400 of the kind in which a fluid such as air or oil is pumped into a cylinder 401 to relatively displace a piston 402. The piston is secured to a rod 403 which permits the piston to perform useful work, for example, to move a table (not shown) for a workpiece in a machine tool. In order to sense the position of the piston 402 with respect to the cylinder 401, the piston rod is hollow and a position sensor generally designated 404 is secured in an axial port in the cylinder 401. The position sensor has a sensor rod 405 extending axially into the piston rod 403. An annular ring 406 interacts with the sensor rod 405 to sense the location of the ring with respect to the sensor rod. The position sensor 404 has a fitting 407 similar to a standard plug for mounting the sensor rod to the cylinder 401. The sensor 404 also has a housing 408 externally mounted to the fitting 407 for enclosing electrical circuits or a connector.

Absolute position sensors using a ferromagnetic restrictive wire have used the geometry in FIG. 24 as described above. A specific case is the series DCTF linear displacement transducer sold by Temposonics, Inc. In this case an annular magnet is secured in the open end portion of the hollow piston rod, and the magnetic field of the magnet interacts with a ferromagnetic restrictive wire axially disposed in a sensor rod of the sensor. A limitation of such a ferromagnetic restrictive wire sensor is its precision or repeatability (said to be about ± 0.002% of full scale).

Therefore, in accordance with another important aspect of the present invention, an inductive position sensor is provided having the geometry of FIG. 24. This is done by including a modulator 409 in the ring 406. Preferably the modulator has conversion gain and is powered by electromagnetic energy coupled from the sensor rod 405. In particular, it is desirable to couple the modulator to the sensor rod via a radio-frequency signal so that radio-frequency power is transmitted from the sensor rod to the modulator, and a phase-indicating radio-frequency signal is transmitted from the modulator to the sensor rod. The radio frequency ensures that there is a high degree of coupling of power and signal between the rod and the modulator. In addition, the radio frequency ensures that there is a high degree of isolation between the phase-indicating radio-frequency signal and the in-phase and quadrature-phase signals used to excite the inductive windings in the sensor rod. Therefore, the modulator may be provided with considerable gain which reduces the power requirements for exciting the sensor rod, and also reduces the pick-up of extraneous signals during transmission from the modulator.

Figure 25:
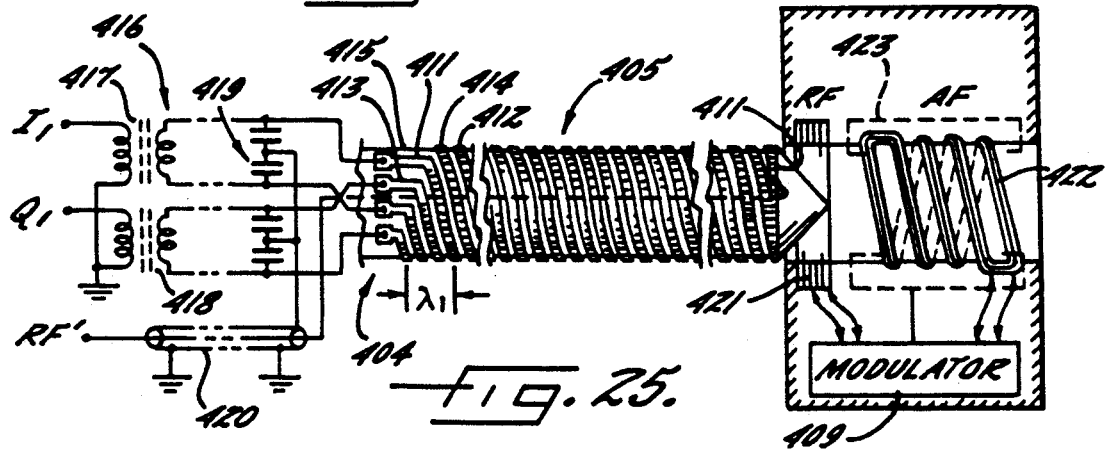
FIG. 25 is a schematic diagram of the linear position sensor of FIG. 24 showing a first layer of periodic windings formed by thin-film deposition and photolithography.

Turning now to FIG. 25, there is shown a schematic diagram of the sensor 404 and modulator 409 and their associated electrical circuits. For the sake of illustration, only the first and highest precision set of in-phase 411, 412 and quadrature-phase 413, 414 windings are shown on a cylindrical substrate 415 forming the sensor rod 405. For the construction in FIG. 25, the windings 411, 412, 413, 414 are formed by etching a thin metal film having been deposited on the substrate. The substrate, for example, is a glass or silica capillary tube, and the metal film is deposited by vacuum deposition of vaporized metal or by electroless plating. In either case, the thickness or conductance of the metal film could be increased by electroplating.

An electroless metal film, for example, is electroplated with copper. The metal film is then coated with a photoresist by dipping or spraying. The capillary tube is then mounted in a numerically-controlled lathe (not shown) having a laser diode and lens mounted to the tool-holder of the lathe. The radial position of the tool-holder is adjusted to focus the laser beam onto the photoresist film. Upon exposure to the laser light, the photoresist polymerizes (in the case of a negative photosensitive resist) or is made to de-polymerize or vaporize (in the case of a positive photoresist such as a sublimible hydrocarbon or wax). The numerical control unit of the lathe is responsive to position sensors or commands drive units so that it knows the angular position of the capillary tube and the axial position of the tool holder. The memory of the numerical control unit is programmed with bits which indicate, at the axial and angular coordinates, whether the desired metal film pattern shown in FIG. 25 has metal or not at each coordinate. As the capillary tube is rotated and the tool holder is slowly driven axially, the bit map is addressed with the axial and angular position values to obtain a binary control signal for modulating the electrical power applied to the laser diode. Therefore, the photoresist is selectively exposed to obtain the desired windings after developing the photoresist, if needed, and etching the metal film with an etchant such as ferric chloride.

If an absolute rather than an incremental position sensor is desired, then one or more offset pitch phase patterns of conductors are formed over and in registration with the first pattern shown in FIG. 25. First an insulating film is formed on the first pattern. This can be done, for example, by depositing a thin film of dielectric material, or by anodizing the first pattern if the first pattern is formed of aluminum. The thin film of dielectric material can be deposited by dipping or spraying the first pattern with a solution or suspension of the dielectric material, and then waiting for the coating to harden or curing the coating by the application of heat or ultraviolet light. The dielectric layer could also be formed by pyrolytic deposition. In the case of a substrate 415 provided by a silica glass capillary tube, a heating element in the form of a nichrome or molybdenum wire could be threaded through the capillary to heat the substrate to about 400 to 500 degrees Celsius in an atmosphere of silane (SiH$_4$) and oxygen to thereby deposit a film of silicon dioxide glass.

The fabrication of the periodic windings 411-414 can be simplified if they are helical as shown in FIG. 25. In such a case, the patterns can be defined by a scribe or the laser in the tool holder of a lathe having a thread-cutting attachment. The windings are similar to a quadruple thread, which can be defined in a single transverse pass by using a four-point scribing tool or a lens system focusing laser light at four points spaced in the axial direction at intervals of a quarter of the wavelength of the periodic windings. Helical windings can also be made by hand by winding four or eight wires at a time. By winding eight wires a time, four driven windings can be evenly spaced from each other by the other four "dummy" windings. Helical windings, however, have the disadvantage that the position sensor will be responsive to rotation of the pick-up coil.

Figure 38:
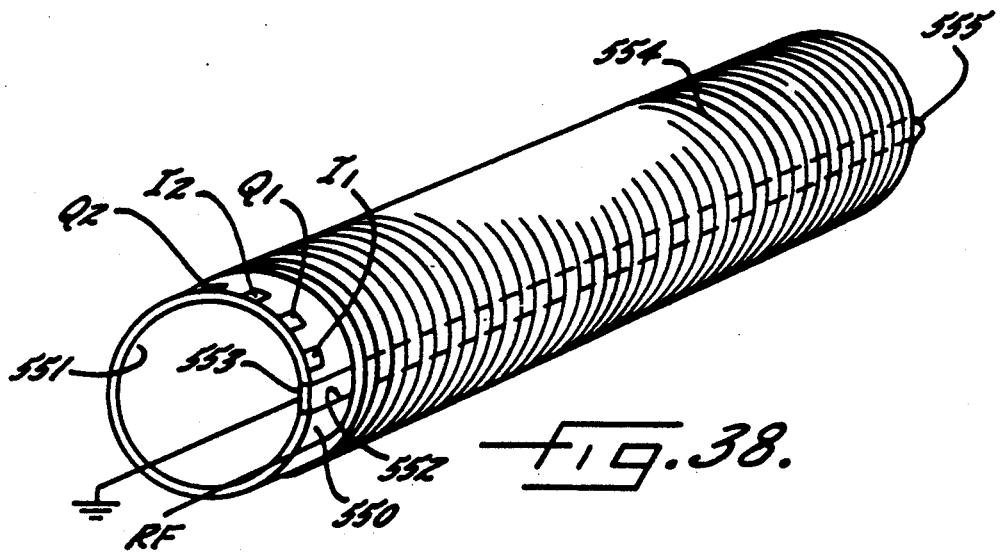
FIG. 38 shows another alternative construction for the periodic windings of the position sensor of FIG. 25 wherein the periodic windings are provided in a laminated strip of the kind illustrated in FIG. 9, and wherein a coil of wire is wound over the laminated strip to provide radiofrequency coupling for wireless transmission of the phaseindicating signal.

In order to couple the radio-frequency signal to the modulator 406, the periodic windings 411-414 in FIG. 25 are excited with the radio-frequency signal. (Alternatively, a separate coil on the sensor rod 405 could be excited with the radio-frequency signal, as shown in FIG. 38.) Preferably the periodic windings 411-414 in FIG. 25 are excited with the radio-frequency signal in a common-mode fashion, for example, by a balanced circuit such as the circuit generally designated 406. The in-phase windings 411, 412 are driven differentially by a first transformer 417, and the quadrature-phase windings are driven differentially by a second transformer 418. The transformers are also useful for impedance matching for low-power operation.

The radio frequency signal could be fed or returned in common-mode fashion via center taps on the secondaries of the transformers. In FIG. 25, however, the radio-frequency signal is returned to ground through RF bypass capacitors 409 to permit the transformers to be located distant from the sensor 404 without radiation of the radio-frequency signal from the wires conveying the in-phase and quadrature-phase signals. The radio-frequency signal is conveyed separately inside a coaxial cable or shielded wire 410, and applied to a common connection 411 near the extreme end of the rod 405. Of course, many other feed arrangements would be satisfactory. The common connection 411, for example, could be grounded, and the in-phase and quadrature-phase signals conveyed by respective twisted-pair wires in a shielded four-conductor cable; in this case, the radio-frequency signal would be conveyed as a common-mode signal through the four conductors in the cable.

To permit the use of high conversion gain, the modulator 409 in FIG. 25 is provided with a radio-frequency transceiving coil 421 that is separate from a pick-up coil 422 for the phase-indicating signal. Therefore, there is a high degree of electrical isolation between the inputs and outputs of the modulator 409, and the modulator is stable even though it is provided with a high conversion gain. In addition, since the pick-up coil 422 need not respond to radio frequencies, it can include a high permeability core providing good inductive coupling to the periodic windings 411-414 and a relatively high impedance for matching to the input of the modulator 409. The isolation between the coils 421, 422 could be enhanced by a radio-frequency and electrostatic shield 423 made of thin metal foil.

Figure 26:
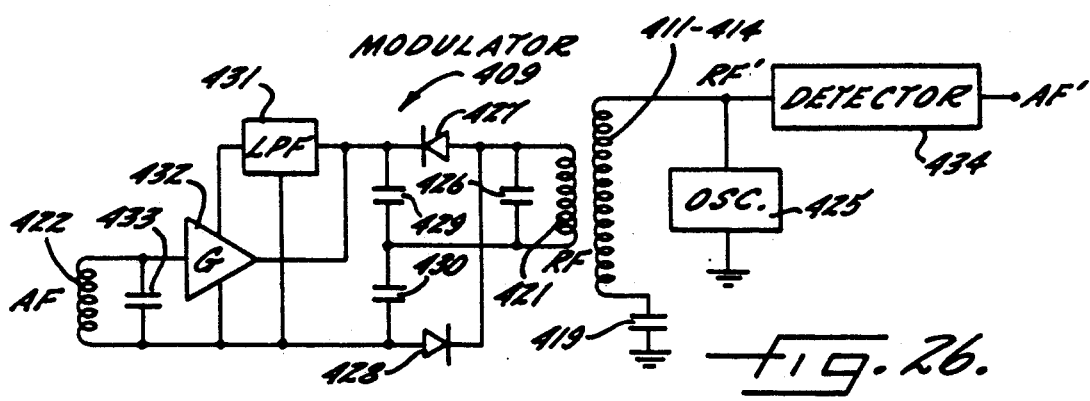
FIG. 26 is a schematic diagram of modulator and detector circuits used with the position sensor of FIG. 24 for wireless transmission of a phase-indicating signal from a pick-up winding.

Turning now to FIG. 26, there is shown a schematic diagram of modulator and detector circuits which can be used with the position sensor 404 of FIGS. 24 and 25. The modulator 409 is powered by the radio-frequency signal RF' generated by a radio-frequency oscillator 425. The oscillator 425 is coupled to the transceiver coil 421 via at least one of the periodic windings 411-414. The transceiver coil 412, for example, is tuned to the radio frequency by a capacitor 426.

To simultaneously provide a source of DC power in the modulator 409 and also modulate the apparent impedance of the coil 421, there is provided a full-wave detector including directional diodes 427, 428 and RF bypass capacitors 429, 430. The diodes 427, 428 are preferably germanium point-contact diodes such as part no. 1N34A, and the capacitors 429, 430 each have the same value of about 1000 to 5000 picofarads. The impedance of the capacitors 429 and 430, however, should be relatively high at the frequency of the signal AF at the frequency of the in-phase and quadrature-phase signals, since the phase-indicating signal at that frequency is applied across the capacitors to cause the directional diodes 427, 428 to modulate the signal RF across the transceiving coil 421. To provide a DC signal relatively free of the phase-indicating signal, the signal across the capacitors 429, 430 is filtered by a low-pass filter or regulator 431 having a cutoff frequency substantially below the frequency of the signal AF. To provide the modulator 409 with a high conversion gain, the signal from the pick-up coil 422 is amplified by an amplifier 432 powered by the DC signal from the low-pass filter 431. The output of the amplifier 432 is applied across the capacitors and to the directional diodes for modulating the RF signal. The conversion gain can be increased still further by tuning the pick-up coil 422 to the AF frequency with a capacitor 433.

The radio-frequency oscillator 425 has a certain output impedance at the RF frequency that is on the order of the impedance of the periodic windings 411-414. To use an oscillator having a buffered low-impedance output, a capacitor or resistor having such an impedance could be inserted in series with the oscillator's output line. On the other hand, if the RF impedance of the periodic windings is much lower than the impedance of the oscillator, then an impedance matching circuit such as a transformer or tap on the oscillator's resonant circuit should be used to match the lower impedance of the periodic windings to the higher impedance of the oscillator and the detector. Therefore, the signal RF' across the periodic windings will be modulated by the modulator 409. A detector 434 recovers a phase-indicating signal AF' at the frequency of the in-phase and quadrature-phase signals driving the periodic windings. The recovered signal is fed back to the phase measuring circuits of FIG. 22 or FIG. 23.

The circuits of FIG. 26 can be adapted for frequency, phase, or amplitude modulation. For frequency modulation, the RF oscillator does not have a buffered output and the transceiving coil is tuned to a frequency that is slightly offset from the natural frequency of oscillation of the oscillator. The natural frequency of the oscillator, for example, is at about the 3 dB point on the response characteristic of the transceiver coil. Therefore, the frequency of the oscillator 425 is "pulled" by a varying amount depending on the apparent impedance of the transceiving coil 421 as the apparent impedance is modulated by the modulator 409. To obtain phase modulation, the oscillator is provided with a buffered output so that its frequency is not pulled, but the oscillator 425 and the transceiving coil 421 are again tuned to slightly different frequencies. To obtain primarily amplitude modulation, the oscillator is provided with a buffered output and a resistive output impedance, and the transceiving coil is tuned to the natural frequency of the oscillator. In practice, however, the frequency, phase and amplitude of the radio-frequency signal can be modulated simultaneously without adverse consequences.

Figure 27:
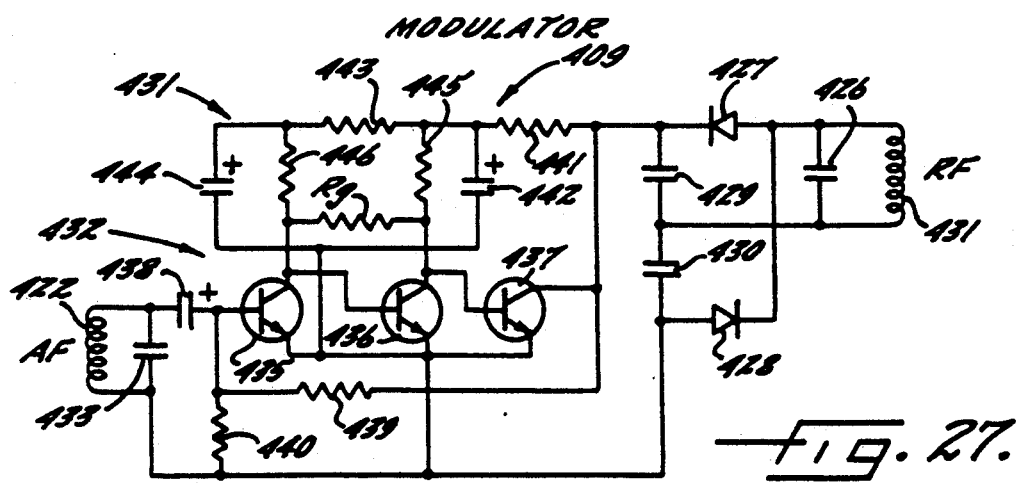
FIG. 27 is a more detailed schematic diagram of the modulator of FIG. 26.

Circuits for the low-pass filter 431 and amplifier 432 are shown in FIG. 27. The amplifier includes three direct-coupled transistors 435, 436 and 437. The base of the first transistor 435 is coupled to the pick-up coil 422 via a bypass capacitor 433. To bias the transistors, the output on the collector of the third transistor 437 is fed back to the base of the first transistor 435 via a resistor 439. A shunt resistor 440 between the base and emitter of the first transistor sets the DC level of the collector of the third transistor 437. The low-pass filter 431 includes a first stage having a series resistor 441 and a shunt capacitor 442, and a second stage having a series resistor 443 and a shunt capacitor 444. The first stage feeds current to a load resistor 445 for the second transistor 437, and the second stage feeds current to a load resistor 436 for the first transistor 435.

For test purposes, the low-pass filter 431 and amplifier 432 were supplied with power from a 9 volt source having an 820 ohm source impedance (connected to the collector of the third transistor), and the coil 22 consisted of about 30 turns of 0.12 mm diameter wire on a U-shaped piece of mu-metal foil about 0.1 mm thick, 6 mm square and having a 1 mm spacing between the poles. The amplifier was stable when using the following component values:

| | |
|---|---|
| Capacitor 438 | 2 microfarad |
| Resistor 439 | 150K ohms |
| Resistor 440 | 47K ohms |
| Resistor 441 | 1K ohms |
| Capacitor 442 | 22 microfarad |
| Resistor 443 | 1K ohms |
| Capacitor 444 | 22 microfarad |

-continued

| | |
|---|---|
| Resistor 445 | 10K ohms |
| Resistor 446 | 10K ohms |

The gain of the amplifier 432 under these conditions was extremely high, and in fact needs to be reduced when more efficient pick-up coils are used. The gain should not be so large that the amplitude modulation index of the signal RF becomes excessive, for example, more than about 50%. The gain of the amplifier can be reduced by decreasing the gain of the transistor stages or by increasing the negative feedback. The negative feedback through resistors 439 and 440 is desirable for stabilizing the closed-loop gain and improving the linearity of the amplifier; this negative feedback can be increased by proportionally reducing the values of these resistors. But for increased stability and reduced noise, the "open loop" gain should not be excessive (e.g., no more that about 10 to 100 times the closed loop gain). In order to reduce the open loop gain, a resistor Rg is added between the collector of the first transistor 435 and the collector of the second transistor 436.

Turning now to FIG. 28 there is shown a detailed schematic of circuits for the radio-frequency oscillator 425 and detector 434. In FIG. 28 the oscillator 425 has a single transistor 450 and uses the periodic windings 411-414 as an inductance for its resonant circuit that also includes capacitors 451 and 452 in addition to the bypass capacitance 419. Power for the oscillator should be provided from a regulated supply +Vs and in addition at least one low-pass filter stage such as a series resistor 453 and a shunt capacitor 454 to prevent the oscillator from being modulated by noise from the supply +Vs. The resistor 453, for example, has a value of 220 ohms, and the capacitor 454 has a value of 100 microfarads.

The transistor 450 is biased by resistors 455 and 456 which have values, for example, of 22 K ohms. A load resistor 457, for example 470 ohms, is connected from the emitter of the transistor 450 to ground. The collector of the transistor 450 receives current from the resistor 453 and is shunted to ground by a RF bypass capacitor 458 which has a value, for example, of 0.01 microfarads. The base of the transistor 450 is connected to the resonant circuit via a capacitor 459 that has a value, for example, of about 10 to 100 picofarads. The capacitors 451 and 452 have values selected in accordance with the desired radio frequency (for example, 1 to 10 megahertz) and the inductance of the periodic windings 411-414. They have values, for example, of about 100 to 1000 picofarads.

In FIG. 28, the detector 434 detects amplitude modulation of the radio-frequency signal RF'. To reject spurious signals at the frequency of the in-phase and quadrature-phase signals, for example due to stray coupling and unbalance in the periodic windings, the detector 434 includes a radio-frequency bypass capacitor 461 which has a value, for example, of 220 picofarads. The amplitude of the signal passing through the capacitor 461 is detected by directional diodes 462 and 463, which preferably are germanium point-contact diodes such as part no. 1N34A. The detector 434 includes an integrating capacitor 464, for example 0.005 microfarads, and a discharge resistor 465. The optimum value of the discharge resistor depends on the value of the integrating capacitor 464, the radio frequency, and the modulation index, and it can be selected by operating an oscilloscope to observe a waveform of the signal across the integrating capacitor 464 and adjusting the resistance 465 for minimum distortion. A typical value is about 56 K ohms. Finally, the detector includes a band-pass filter selecting the frequency of the in-phase and quadrature-phase signals. This band-pass filter includes a series capacitor 466, a series resistor 467, and a shunt capacitor 468. The series capacitor 466, for example, has a value of 0.1 microfarads, the series resistor has a value of 1 K ohms, and the shunt capacitor has a value of 0.005 microfarads.

Turning now to FIG. 29, there is shown a schematic diagram of an alternative modulator circuit that has been designed for use in a miniature "short stroke" position sensor. It is desired, for example, to use such a position sensor for sensing the position of a spool in a spool valve, and in such a case the sensor rod, modulator and associated RF and AF coils should fit inside the spool. To save space, a combined pick-up and transceiving coil 500 receives the AF signal as a differential signal and the RF signal as a common mode signal. A single transistor 501 functions as an amplifier. A single directional diode 502 (e.g., part no. 1N34A) simultaneously functions as a rectifier and a modulator. A resistor 503 (e.g., 15 K ohms) and a capacitor 503 (e.g., 0.47 microfarads) function as a low-pass filter to bias the transistor 501, and the capacitor 504 also functions as a high-pass filter to couple the AF signal to the transistor. Also illustrated in FIG. 29 is the use of center-tapped transformers 505 and 506 for providing a ground return path for the radio-frequency signal RF'.

If space is available, then additional components could be added to the modulator in FIG. 29. A resistor, for example, could be connected between the base and emitter of the transistor 501 to increase the emitter-to-collector bias voltage for increased gain and for permitting the signal RF to have an increased amplitude. A capacitor could be connected across the base and emitter of the transistor 501 to prevent the transistor from responding to radio frequency signals; this would make the differential balance of the coil 500 less important. Alternatively, this additional capacitor could be connected directly across the coil 500 to shunt the AF singal; in either case the capacitor could tune the differential response of the coil to the AF frequency.

Turning now to FIG. 30, there is shown an axial view of a ferromagnetic pole-piece assembly for use with the pick-up coil 422 of FIG. 25. The assembly includes a multiplicity of planar laminations 511 which define a four-pole configuration in which the poles are spaced at 90 degree angles. A single lamination 511 is shown in FIG. 31. The laminations are punched or photochemically machined (i.e., using photolithography) from ferromagnetic sheets. The ferromagnetic sheets, for example, are made of high permeability nickel-iron alloy such as "mu-metal." Before assembly, the laminations are coated with varnish to electrically insulate the laminations from each other and thereby reduce electrical losses due to eddy currents.

As further shown in the longitudinal section view of FIG. 32, eddy losses are further reduced by using multiple laminations per pole, for example, two per pole. The opposite poles (spaced by 180 degrees) are disposed at the same axial position, neighboring poles spaced by 90 degrees are offset axially by a quarter of a wavelength, and overlapping poles are displaced by a half of a wavelength. Due to this spacing, the coil 422 can be wound around the poles of the pole-piece assembly as shown in FIGS. 30 and 32 to obtain the electrical response indicated by the schematic drawing of the windings in FIG. 25. The pole-piece assembly, however, provides increased inductive coupling of the pick-up coil 422 to the periodic windings in the sensor rod 405, and also increases the impedance of the pick-up coil so that it is better matched to the input impedance of the modulator. Therefore the phase-indicating signal is increased in amplitude relative to noise and interference.

As shown in FIGS. 33 and 34, the pole-piece assembly 510 carrying the pick-up coil 422 is encapsulated together with the modulator (wired on a circuit board 520) and the radio-frequency transceiving coil 421 to make the ring 406. The encapsulant, for example, is epoxy resin mixed with chopped glass fiber and a catalyst. The components are pre-assembled, aligned in a mold, and then the encapsulant mixture is injected into the mold. For mounting purposes or to provide channels for the flow of hydraulic oil, the ring 406 is formed with four holes 521 which pass through the ring in the axial direction and are aligned between the neighboring poles of the pole-piece assembly.

Figure 35:
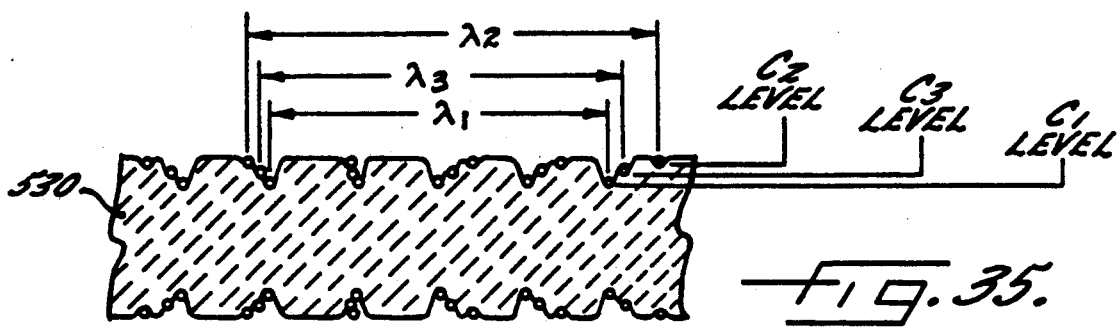
FIGS. 35 and 36 are respective section and plan views showing an alternative construction for the periodic windings of the position sensor of FIG. 25 wherein helical coils of wire are wound on a multi-pitch, multi-level cylindrical coil form.
Figure 36:
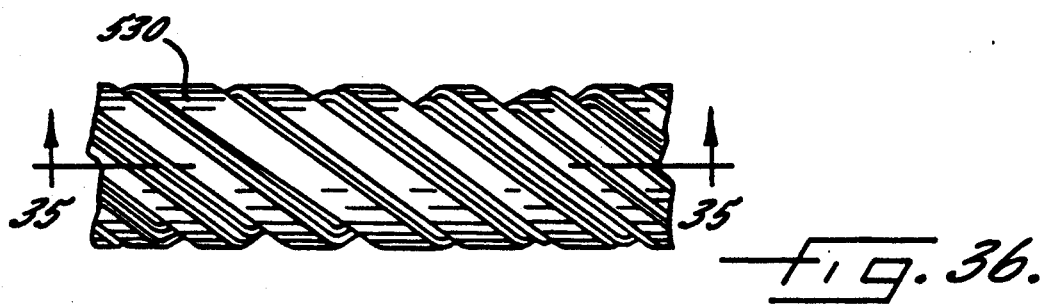

Turning now to FIGS. 35 and 36, there are shown respective section and plan views of an alternative construction for periodic windings of the position sensor of FIG. 25. In this case a sensor rod 530 is provided which functions as a multi-level coil form for three sets of four-wire coils. The first set of conductors "$C_1$" are wound at the deepest level and are spaced at intervals of the first wavelength $\lambda_1$ to provide the periodic phase pattern having the highest precision. The second set of conductors "$C_2$" are wound at the shallowest level and are spaced at intervals of the second wavelength $\lambda_2$. The third set of conductors "$C_3$" are wound at the middle level and are spaced at intervals of the third wavelength $\lambda_3$. The respective phase patterns for these sets of conductors are shown in FIGS. 2 and 3.

To define the three levels on the rod 530, the rod could be machined using a lathe with a thread-cutting attachment. In this case the cutting tool must longitudinally traverse the rod at least three times; at least one pass must be made for each respective level since each level has a different wavelength and consequently a different helical pitch.

Figure 37:
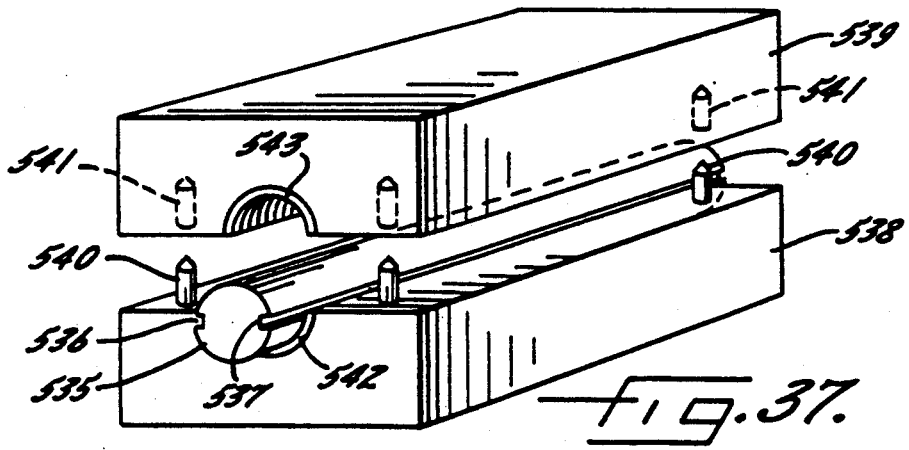
FIG. 37 is an isometric view showing a multi-pitch, multi-level coil form being formed by a stamping operation.

As illustrated in FIG. 37, a rod 535 could be formed with multi-levels of helical grooves of different pitches by stamping or molding. For stamping, the rod 535 is first formed with longitudinal grooves 536, 537 which ensure clean cutting of the helical grooves where the stamping dies 538, 539 meet at the bottom of the stamping stroke. The stamping dies could be formed with alignment pins 540 and mating bores 541 to ensure that the helical grooves stamped by the top die 539 register with the helical grooves stamped by the bottom die. The rod 535 preferably is made of uncured epoxy-fiberglass that is cured during or possibly after stamping. The actual helical grooves are formed by semi-cylindrical inserts 542, 543 in the respective dies 538, 539. Such inserts could be made by first machining a master rod, depositing material around the rod, and then removing the rod from the deposited material. The master rod, for example, could be a machined graphite rod that is chrome electroplated to provide hard chrome inserts. Inserts for a two-piece mold could be made in a similar fashion. After molding a rod, longitudinal grooves could be cut to remove the malformed areas formed adjacent to the meeting of the mold pieces.

Turning now to FIG. 38, there is shown still another alternative construction for the rod 405 of the sensor 404 of FIG. 24. In this case the periodic phase windings are provided by a laminated strip 550 of the kind shown being laminated in FIG. 9. A substrate 551 such as a polyesterfiberglass rod is first machined or molded with a longitudinal slot 552 for receiving a strip 553 carrying a copper foil layer on its underside. The strip 553 serves to present an alignment edge to the laminated strip 550 The copper foil layer on the strip 553 provides a return to ground. A radio-frequency coil 554 is wound over the laminated strip 550 and connected at its extreme end 555 to the copper foil layer.

Figure 39:
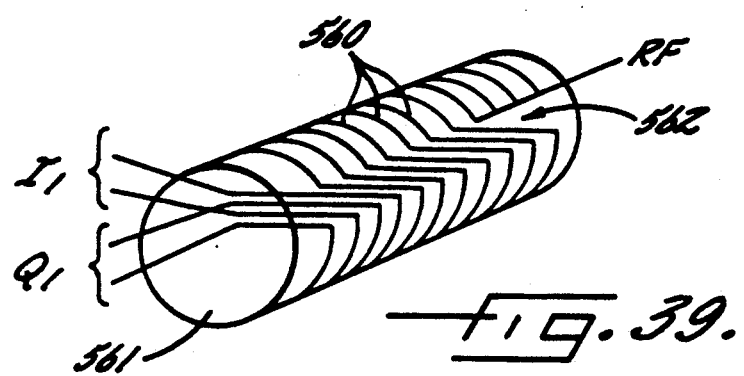
FIG. 39 shows an alternative geometry for the periodic windings of FIG. 25 or of FIGS. 26 and 27 in order to make the phase-indicating signal substantially independent of rotation of the pick-up coil about the axis of position sensor.

The construction in FIG. 38 has the advantage that the position sensor can be virtually insensitive to rotation of the pick-up coil about the axis of the sensor rod. This same advantage can be obtained by modification of the periodic phase patterns for the thin-film construction of FIG. 25 and the wire-wound construction of FIGS. 35 and 36. In FIG. 39, the conductors 560 on the cylindrical substrate 561 are aligned in the circumferential direction about most of the periphery of the substrate. In a longitudinal offset zone 562, however, the conductors 560 are diagonally skewed sharply in the axial direction.

Figure 40:
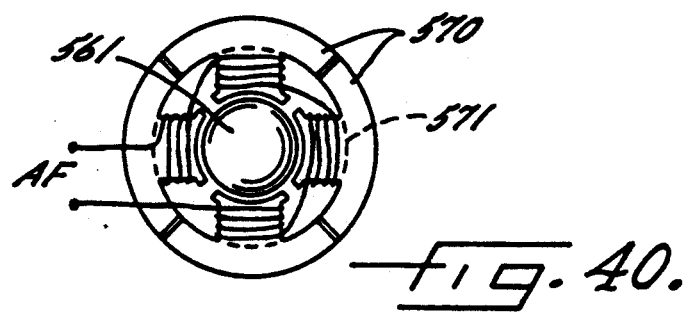
FIG. 40 shows a ferromagnetic pole-piece assembly for use with the periodic windings of FIGS. 38 and 39.

The construction in FIGS. 38 and 39 requires the use of a pick-up coil different from that shown in FIGS. 25, 29, or 30-32. Preferably the pick-up coil has a high degree of radial symmetry. As shown in FIG. 40, a multipole configuration such as an arrangement of four pole-pieces 570 alternately stacked with mu-metal rings 571 could be used. However, a "pancake" coil construction of FIG. 41 could be used instead. In this case, the pick-up coil assembly includes a stack of alternate pancake coils 580 and mu-metal washers 581 (and each washer could consist of a number of thin washers laminated together, to reduce eddy currents). The magnetic circuit at the outer periphery could be closed by a mu-metal ring which could be split into two arcuate pieces 582 for assembly after the coil 580 is wound. The coil 580 could be wound when a cylindrical mandrel (not shown) is inserted into a stack of washers 580; the washers could be spaced by the required amount of about a quarter of a wavelength by spacer rings (similar to the rings 594 and 595 in FIG. 42).

Figure 41:
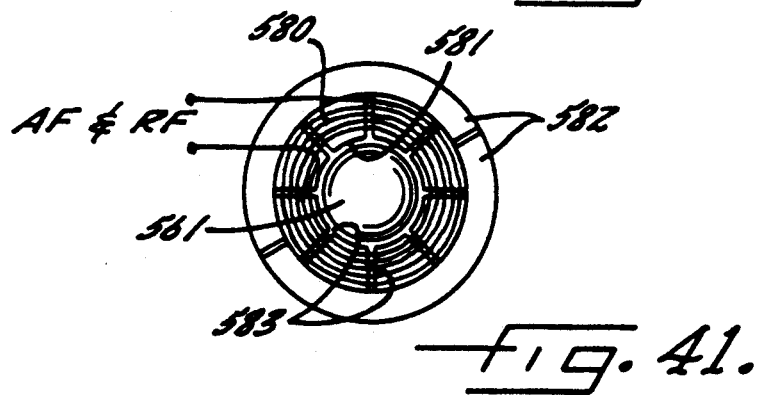
FIG. 41 shows an alternative ferromagnetic core assembly having "pancake" pick-up coils for use with the periodic windings of FIGS. 38 and 39.

Another advantage of the pancake coil construction of FIG. 41 is that the washers 541 can be formed with radial slits 583 (for example by photochemical machining or photolithography) which enable radio-frequency inductive coupling to occur between the pancake coils and the periodic windings or the RF coil 554 of FIG. 38. Therefore the pancake coils can be used to provide the a differential coil 500 for the modulator of FIG. 29 (when also used in connection with the periodic windings of FIGS. 38 or 39). A specific example of this is the miniaturized differential coil 590 in FIG. 42, which includes a mu-metal washer 591 with radial slits (not shown) similar to the slits 583 in the washer 581 in FIG. 41.

Figure 42:
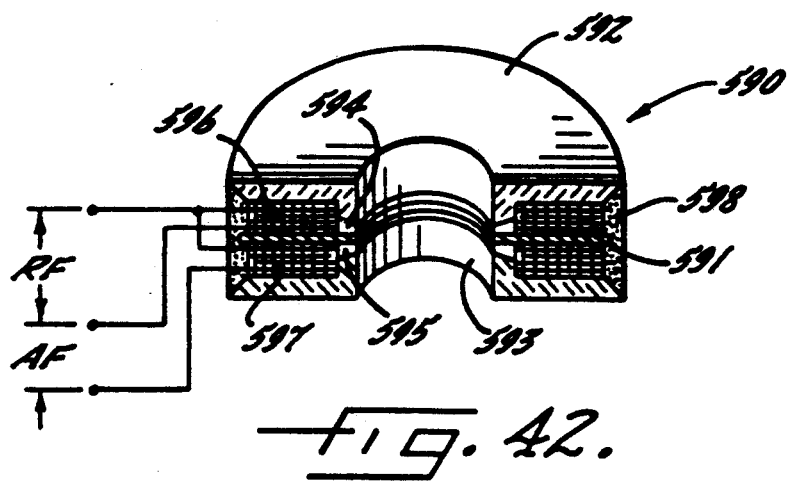
FIG. 42 shows still another alternative ferromagnetic pole-piece and pick-up coil assembly for use with the modulator circuit of FIG. 29 and the periodic windings of FIG. 39.

To facilitate the winding of the pancake coils and to insure a good differential balance with respect to radio frequencies, the assembly 590 includes two ferrite buttons 592 and 593. The buttons are assembled on a cylindrical mandrel (not shown) with the mu-metal disc 591 spaced between the buttons by spacer rings 594, 595 made of insulating material such as fiberglass or resin impregnated paper. The spacers, slotted mu-metal washer and buttons are pressed together and could be adhesively bonded together at this time. Then two multilayer coils 596, 597 are wound with the same number of turns of wire and coated with adhesive. Once that adhesive (for example epoxy) has cured, the radial slots in the mu-metal disc can be extended to the outer periphery by cutting with diagonal cutter pliers, so that the mu-metal ring is separated into multiple sections. Then a mixture 598 of ferrite powder and resin such as epoxy is applied to the periphery between the buttons, for example by injection molding. As a result of this construction, both coils 596, 597 are linked by a radio-frequency magnetic circuit including the buttons and the ferrite powder, and since they have the same number of turns, they should be well balanced with respect to the radio-frequency signal when they are wired as shown in FIG. 42 for use with the modulator as shown in FIG. 29.

Although a radio-frequency powered modulator has been described above for use as a pick-up device with the sensor rods as constructed in FIGS. 25, 35-36, 38 or 39, it should be apparent that just a pick-up coil assembly providing the AF signal would be needed if the AF signal could be conveyed directly by wires to the phase detector circuits of FIGS. 22 or 23. Alternatively, a ferromagnetic core or ring could be used to link a helical pick-up coil wound on top of the periodic windings or phase patterns. For the construction in FIG. 38, for example, a ferromagnetic ring could be used having an inside diameter slightly larger than the outside diameter of the sensor rod, and an axial length of about ½ of a wavelength. A number of such rings could be assembled together at intervals of a wavelength. In such a case, the operation of the device would be analogous to the operation of the sensor of FIG. 16 or 17. The relative advantages and disadvantages would also be analogous. Therefore, in order to increase the magnetic coupling, it would be desirable in this case to use a substrate in the form of a ferromagnetic rod or tube, or a nonmagnetic substrate could be first deposited with a thin ferromagnetic film such as mu-metal To eliminate electrostatic coupling, an electrostatic shield such as an additional thin conductive film layer or a wrapped foil layer should be disposed on top of the periodic windings, and the pick-up coil would be wound or fabricated on top of the shield. Electrical balance with respect to inductive coupling with the periodic phase windings would still be an important consideration except for very short sensor rods.

In situations where wireless transmission of the phase indicating signal is necessary but the signal level generated by the pick-up device is very small, it may be desirable to use a harmonic modulator in the pick-up device, and detect the harmonic signal with a synchronous detector The signal level to be generated by the pick-up device may be very small, for example, because of a desire to excite the coils (411-414) in the sensor rod (405) with low power, or to use a very small pick-up device that must have a very small modulator circuit, or to use a very long sensor rod. To compensate for the low signal level generated by the pick-up device, the harmonic signal can be selected and amplified considerably before it is detected.

The simplest harmonic modulator is a directional diode. As shown in FIG. 43, a pair of directional diodes 601, 602 are connected in parallel but with opposite polarity to form a balanced second-harmonic modulator for a pick-up coil 603. The pick-coil 603, for example, responds to a one megahertz RF signal from a source 604, and a 5 kilohertz AF signal from a source 605. As shown in the timing diagram of FIG. 44, the voltage v across the diodes is modulated from a clipped sinusoid 611 at 1 megahertz between a signal 612 where the 5 kilohertz signal has a first polarity (negative) and a signal 613 where the 5 kilohertz signal has a second polarity (positive). The clipped sinusoid 611 at 1 megahertz is symmetrical and therefore has no second harmonic. The deviated signals 612 and 613, however, include a second harmonic component that is double side band, suppressed carrier amplitude-modulated by the 5 kilohertz signal. The second harmonic 614, for example, can be seen by subtracting the signal 611 from the signal 612.

Turning now to FIG. 45, there is shown a balanced second-harmonic modulator generally designated 621 employing a pair of complementary transistors 622 and 623 to provide conversion gain. The transistors 622 and 623 each function in a manner similar to the transistor 501 in FIG. 29 to increase or decrease the clipping level of their corresponding diode 624, 625. A capacitor 626 can be added to ensure that the difference between the clipping levels of the two diodes 624, 625 is substantially constant.

Turning now to FIG. 46, there is shown a balanced second-harmonic modulator generally designated 630 employing an operational amplifier 631 to provide conversion gain. A diode string 632 as well as a capacitor 633 ensure that the difference between the clipping levels of the diodes 634 and 635 is substantially constant. A pair of diodes 636 provide negative feedback so that the amplifier 631 functions as a symmetrical limiter. The operational amplifier 631 could be a low-voltage CMOS type. In this case the entire circuit 630 could be integrated, and diode pairs 637, 638 would protect the MOS capacitors.

Turning now to FIG. 47, there is shown a sensor element 640 providing balanced second-harmonic modulation by the magnetic saturation of ferromagnetic material. Such a sensor element could be most useful for a short stroke, ultraminiature position sensor where the winding of a wire coil for the modulator of FIG. 43 would be difficult. As shown, the sensor element 640 is cylindrical and coaxial about its corresponding sensor rod 641.

The sensor element includes a ring 642 of insulating material about which a magnetic circuit is disposed, and a cup of insulating material 643 into which the ring 642 is placed. The ring 642 has parallel end faces upon which are mounted flux collecting rings 644, 645 made of a ferromagnetic material such as a ferrite layer or mu-metal foil. If mu-metal foil is used, the rings should be slotted radially to prevent the rings from providing an electrical short-circuit in the circumferential direction about the ring.

The magnetic circuit also includes at least one saturable section 646 such as a sliver, thread or constriction of ferrite or mu-metal foil that is mounted on the outer circumference of the ring 642. The windings 646 on the sensor rod 641 should be driven with sufficient RF current to saturate the saturable section 646. Since the magnetic circuit could be formed by depositing a ferromagnetic material upon the entire outer surface of the ring 642 and then etching or abrading away some of this deposited material about the outer circumference of the ring, it should be possible use micro-photolithographic techniques to form the magnetic circuit on a very small ring 642.

Turning now to FIG. 48, there is shown a schematic diagram of a synchronous detector to be used with the balanced second-harmonic modulator of FIG. 43, 45, 46, or 47. An oscillator 651 generates a signal at eight times the desired RF frequency, and clocks a three-bit binary counter 652 which provides the RF frequency. The RF frequency signal is buffered by a driver 653 which is isolated from the sensor rod coils 411–414 by an electrolytic capacitor 654.

To select the second harmonic of the RF frequency, a transformer 655 tuned to the second harmonic is inserted between the capacitor 654 and the sensor rod coils 411–414. Also, the primary of the transformer 655 could be center tapped and connected to a "dummy" loading coil 656 which could be tuned to null out the RF signal from reaching the secondary of the transformer. The second harmonic passes to an amplifier 657, and is further selected in a tuned output transformer 658. The secondary of the output transformer is center tapped to form part of a balanced demodulator 659 which is shown using controlled electronic switches 660, 661 such as IGFETS or CMOS transmission gates. The required switching phases are obtained by respective OR gates 662, 663 receiving signals from selected outputs of a three-bit decoder 664 which decodes the outputs of the three-bit binary counter 652. The values sampled by the electronic switches 660, 661 are temporarily held by a capacitor 665 when both switches are open. The desired AF signal is obtained by a conventional active filter 666 that filters the signal on the holding capacitor 665.

In view of the above, there has been disclosed a method for enabling an "Inductosyn" type of variable phase transformer to sense absolute position. Also, for low-cost applications where the utmost in accuracy and precision is not required, there have been disclosed absolute position sensors for linear and rotary position sensing, and for providing high signal levels when driven with low excitation currents. The position sensors can be fabricated using either capital-intensive techniques as in the case of the laminated windings, or labor-intensive techniques as in the case of lap-wound and helical wound coils (although a numerically-controlled lathe could be used to wind the helical coils with a variably programmed pitch for obtaining a sinusoidal density along the length of the sensor for each driven winding). For use with any of the position sensors, there has also been provided an integrated circuit for interfacing to the data bus of a microcomputer. High-precision position sensors have also been disclosed for use in hydraulic or pneumatic cylinders and valves.

APPENDIX I

Motorola MC6800 Program Listing

| APPENDIX I. Motorola MC6800 Program Listing | | | |
|---|---|---|---|
| 0200 | INTERRUPT COUNTER | | |
| 0201 | PHASE A | (4λ) Switch Top | |
| 0202 | PHASE B | (3λ) Switch Bottom | |
| 0203 | SUM HIGH | | |
| 0204 | SUM LOW | | |
| 0205 | DIFFERENCE HIGH | | |
| 0206 | DIFFERENCE LOW | | |
| 0400 | B6 | LDA A $0200 | MIVEC Rotine |
| 0401 | 02 | | |
| 0402 | 00 | | |

APPENDIX I.
Motorola MC6800 Program Listing

| | | | |
|---|---|---|---|
| 0403 | 4C | INC A | Increment Interrupt Counter |
| 0404 | B7 | | |
| 0405 | 02 | STA A $0200 | |
| 0406 | 00 | | |
| 0407 | 81 | CMP A $06 | |
| 0408 | 06 | | |
| 0409 | 26 | BNE SKIPA | |
| 040A | 0C | | |
| 040B | B6 | LDA A $F008 | |
| 040C | F0 | | |
| 040D | 08 | | |
| 040E | B7 | STA A $0201 | |
| 040F | 02 | | |
| 0410 | 01 | | |
| 0411 | 86 | LDA A #$37 | Select Phase B |
| 0412 | 37 | | |
| 0413 | B7 | STA A $F009 | |
| 0414 | F0 | | |
| 0415 | 09 | | |
| 0416 | 3B | .RTI | |
| 0417 | 81 | CMP A $0C | |
| 0418 | 0C | | |
| 0419 | 2C | BGE SKIPB | |
| 041A | 01 | | |
| 041B | 3B | RTI | |
| 041C | 7F | CLR $0200 | SKIPB Reset Interrupt Counter |
| 041D | 02 | | |
| 041E | 00 | | |
| 041F | B6 | LDA A $F008 | Sample Phase B |
| 0420 | F0 | | |
| 0421 | 08 | | |
| 0422 | B7 | STA A $0202 | |
| 0423 | 02 | | |
| 0424 | 02 | | |
| 0425 | 86 | LDA A #$3F | Select Phase A |
| 0426 | 3F | | |
| 0427 | B7 | STA A $F009 | |
| 0428 | F0 | | |
| 0429 | 09 | | |
| 042A | 3B | RTI | |
| 0440 | BD | JRS #FEID | START Executive Program |
| 0441 | FE | | |
| 0442 | 1D | | Clear Display |
| 0443 | 86 | LDA A #$3F | |
| 0444 | 3F | | |
| 0445 | B7 | STA A $F009 | Initialize PIA |
| 0446 | F0 | | |
| 0447 | 09 | | |
| 0448 | 7F | CLR $0200 | Initialize Interrupt Counter |
| 0449 | 02 | | |
| 044A | 00 | | |
| 044B | 0E | CLI | Enable Interrupt |
| 044C | B6 | LDA A $0201 | COMPUTE Routine |
| 044D | 02 | | |
| 044E | 01 | | |
| 044F | 16 | TAB | |
| 0450 | F0 | SUB B $0202 | |
| 0451 | 02 | | |
| 0452 | 02 | | |
| 0453 | F7 | STA B $0205 | |
| 0454 | 02 | | |
| 0455 | 05 | | |
| 0456 | 7F | CLR $0206 | |
| 0457 | 02 | | |
| 0458 | 06 | | |
| 0459 | 80 | SUB A #$6C | |
| 045A | 6C | | |
| 045B | B7 | STA A $0203 | |
| 045C | 02 | | |
| 045D | 03 | | |
| 045E | 7F | CLR $0204 | |
| 045F | 02 | | |
| 0460 | 04 | | |
| 0461 | 8D | BSR PRECIS | |
| 0462 | 14 | | |
| 0463 | CE | LDX #$2600 | DISPLAY Routine |
| 0464 | 26 | | |
| 0465 | 00 | | Reset Display Pointer |
| 0466 | FF | STX #$0102 | |
| 0467 | 01 | | |
| 0468 | 02 | | |
| 0469 | B6 | LDA A $0203 | |
| 046A | 02 | | |
| 046B | 03 | | |
| 046C | BD | JSR DISPLAY | |
| 06D | FF | | |
| 046E | 6D | | |
| 046F | B6 | LDA A $0204 | |
| 0470 | 02 | | |
| 0471 | 04 | | |
| 0472 | BD | JSR DISPLAY | |
| 0473 | FF | | |
| 0474 | 6D | | |
| 0475 | 20 | BRA COMPUTE | |
| 0476 | D5 | | |
| 0477 | 74 | LSR $0203 | PRECIS Subroutine |
| 0478 | 02 | | |
| 0479 | 03 | | |
| 047A | 76 | ROR $0204 | |
| 047B | 02 | | |
| 047C | 04 | | |
| 047D | 74 | LSR $0203 | |
| 047E | 02 | | |
| 047F | 03 | | |
| 0480 | 76 | ROR $0204 | |
| 0481 | 02 | | |
| 0482 | 04 | | |
| 0483 | B6 | LDA A $0206 | |
| 0484 | 02 | | |
| 0485 | 04 | | |
| 0486 | B0 | SUB A $0204 | |
| 0487 | 02 | | |
| 0488 | 06 | | |
| 0489 | B6 | LDA A $0205 | |
| 048A | 02 | | |
| 048B | 05 | | |
| 048C | B2 | SUBC A $0205 | |
| 048D | 02 | | |
| 048E | 03 | | |
| 048F | 8B | ADD A #$20 | |
| 0490 | 20 | | |
| 0491 | 84 | AND A #$C0 | |
| 0492 | C0 | | |
| 0493 | BA | ORA A $0203 | |
| 0494 | 02 | | |
| 0495 | 03 | | |
| 0496 | B7 | STA A $0203 | |
| 0497 | 02 | | |
| 0498 | 03 | | |
| 0499 | 39 | RTS | |

I claim:

1. A position sensor comprising, in combination:
a support extending along a certain direction over a certain range;
electrically conductive windings mounted on said support, said electrically conductive windings including a first set of windings having a first and second electrically conductive windings, and a second set of windings having third and fourth electrically conductive windings;
said first set of windings being disposed in a first periodic spatial pattern extending along said direction over said range, said first periodic spatial pattern having a first pitch, said first periodic spatial pattern having multiple cycles over said range,
said second set of windings being disposed in a second periodic spatial pattern extending along said direction over said range, said second periodic spatial pattern having a second pitch, said second periodic spatial pattern having multiple cycles over said range, said second pitch being substantially different from said first pitch, said first and second sets of windings being disposed in close proximity to each other and being registered one over the other along said direction and over said range, said first and second windings being arranged to be connectable to a plural-phase source of alternating electrical current, when second pair of windings is disconnected, to establish along said direction and over said range a first electromagnetic field having a first phase that is a predetermined first periodic function of position within said range, said first periodic function having a predetermined first wavelength approximately equal to said pitch, such that said first phase varies continuously over two pi ($2\pi$) radians over a distance of said first wavelength in said range and said first phase is proportional to position in said range but said first phase has the same value at two different positions in said range which are spaced apart by a distance of said first wavelength, said third and fourth windings being arranged to be connectable to a plural-phase source of alternating current, when said first set of windings is disconnected, to establish along said direction and over said range a second electromagnetic field that has a second phase that is a predetermined second periodic function of position within said range, said second periodic function having a predetermined second wavelength approximately equal to said second pitch, such that said second phase varies continuously over two pi ($2\pi$) radians over a distance of said second wavelength in said range and said second phase is proportional to position in said range but said second phase has the same value at two different positions in said range which are spaced apart by a distance of said second wavelength, said first wavelength being different from said second wavelength so that every position within said range determines a unique combination of said first phase and said second phase but neither said first phase alone nor said second phase alone is sufficient to uniquely determine said position, and displaceable means located at a selected position along said direction and in said range for sensing the phase of the electromagnetic field at said selected position generated by said alternating electrical current and for electromagnetically inducing in said windings mounted on said support a signal indicating the sensed phase of said electromagnetic field at said selected position, whereby the phase of the electromagnetic field at the selected position is determinable from said signal without a wire connection between said displaceable means and said windings mounted on said support.

2. The position sensor as claimed in claim 1, wherein said displaceable means is a ferromagnetic core.

3. The position sensor as claimed in claim 2, wherein said windings mounted on said support include a fifth electrically conductive winding in which said signal is induced.

4. The position sensor as claimed in claim 2, wherein said ferromagnetic core includes two ferromagnetic elements offset from each other along said direction by a distance approximately equal to said first and second pitches.

5. The position sensor as claimed in claim 1, wherein said displaceable means includes modulator means responsive to said sensed phase of said electromagnetic field at said selected position for generating said signal at a frequency higher than the frequency of said alternating current.

6. The position sensor as claimed in claim 1, further including an integrated circuit having means for defining the frequency and phases of an internal plural-phase source, means for alternately connecting said first and said sets of windings to said internal plural-phase source, and a phase discriminator for determining the phase of said signal.

7. The inductive position sensor as claimed in claim 1, wherein said first and second sets of windings are disposed on respective strips of film that are laminated in registration with each other.

8. The inductive position sensor as claimed in claim 1, wherein said first support is cylindrical and elongated along said direction, and said first support includes grooves defining the positions of said first and second sets of windings.

9. The inductive position sensor as claimed in claim 1, wherein said first support is cylindrical and elongated along said direction, the windings in said first and second sets of windings are wound circumferentially around said first support but are aligned circumferentially with respect to said first support about most of the periphery of said support.

10. The inductive position sensor as claimed in claim 9, wherein the windings in said first and second sets of windings are diagonally skewed toward said direction at locations on said periphery of said support where said windings are not aligned circumferentially with respect to said first support.

11. An inductive position sensor of the kind having a set of electrically conductive windings disposed in fixed relation to each other, said set of windings including at least two windings disposed in periodic spatial patterns having multiple cycles along a certain direction to provide a time-varying magnetic field having a phase that is a periodic function of position along said direction when said windings are driven by at least two phases of an electrical signal at a first frequency, and a pick-up winding moveable with respect to said set of electrically conductive windings along said direction for providing a phase indicating signal responsive to said time-varying magnetic field, wherein the improvement comprises:

a transmitter circuit disposed for relative movement with said pick-up winding, said transmitter circuit including at least one transistor having an input terminal and an output terminal, said input terminal being connected to said pick-up winding for receiving and amplifying said phase indicating signal, and means for rectifying a signal inductively coupled from said set of windings at a second frequency substantially greater than said first frequency to provide a rectified signal, said means for rectifying being connected to said output terminal of said transistor to power said transistor with said rectified signal and to provide an impedance modulated by the phase indicating signal amplified by said transistor and thereby providing a modulated signal inductively coupled back to said set of windings, and a receiver circuit including means for generating said signal at said second frequency and energizing said set of windings with said signal at said second frequency, and means for demodulating said modulated signal coupled back to said set of windings to thereby provide a signal having a phase indicating the relative position of said pick-up winding with respect to said set of windings.

12. The inductive position sensor as claimed in claim 11, wherein said means for rectifying includes at least one directional diode which provides an amplitude modulated signal at said second frequency, and said means for demodulating is an amplitude modulation (AM) detector.

13. The inductive position sensor as claimed in claim 11, wherein said pick-up winding includes a set of at least two coils inductively linked to said set of windings, said set of coils being electrically connected and arranged to provide a differential mode signal at said first frequency, and a common mode signal at said second frequency, said coils in said set of coils being connected to said transistor to couple said differential mode signal to the base of said transistor, and said set of coils being electrically connected to said means for rectifying to rectify and modulate said common mode signal.

14. The inductive position sensor as claimed in claim 13, wherein said set of windings includes an elongated multithread cylindrical coil, and said inductive position sensor includes means for connecting alternate threads of said cylindrical coil to different phases of said electrical signal at said first frequency, and means connecting said cylindrical coil to said means for energizing and said means for demodulating to apply said signal at said second frequency across the length of said cylindrical coil and obtain said modulated signal from across the length of said cylindrical coil.

15. The inductive position sensor as claimed in claim 11, wherein said set of windings includes an elongated multithread cylindrical coil, and said inductive position sensor includes means for connecting alternate threads of said cylindrical coil to different phases of said electrical signal at said first frequency, and means connecting said cylindrical coil to said means for energizing and said means for demodulating to apply said signal at said second frequency across the length of said cylindrical coil and obtain said modulated signal from across the length of said cylindrical coil.

16. The inductive position sensor as claimed in claim 11, wherein said transmitter circuit is a balanced second harmonic modulator for providing a double sideband suppressed carrier amplitude modulated signal at twice said second frequency.

17. An inductive position sensor of the kind having a set of electrically conductive windings disposed in fixed relation to each other, said set of windings including at least two windings disposed in periodic spatial patterns having multiple cycles along a certain direction to provide a time-varying magnetic field having a phase that is a periodic function of position along said direction when said windings are driven by at least two phases of an electrical signal at a first frequency, and a pick-up sensor moveable with respect to said set of electrically conductive windings along said direction for providing a phase indicating signal responsive to said time-varying magnetic field, wherein said pick-up sensor includes means for picking up an electromagnetic field signal coupled from said set of windings at a second frequency substantially greater than said first frequency, and means for modulating the second frequency signal by the phase indicating signal to provide a modulated signal coupled back to said set of windings, and a receiver circuit including means for generating said signal at said second frequency and energizing said set of windings with said signal at said second frequency, and means for demodulating said modulated signal coupled back to said set of windings to thereby provide a signal having a phase indicating the relative position of said pick-up sensor with respect to said set of windings.

18. The inductive position sensor as claimed in claim 17, wherein said pick-up sensor includes a set of at least two coils inductively linked to said set of windings, said set of coils being electrically connected and arranged to provide a differential mode signal at said first frequency, and a common mode signal at said second frequency, and said means for modulating is a modulator circuit connected to said coils in said set of coils to modulate said differential mode signal by said common mode signal to provide a modulated signal applied to at least one of said coils in said set of coils.

19. The inductive position sensor as claimed in claim 17, wherein said set of windings includes an elongated multithread cylindrical coil, and said inductive position sensor includes means for connecting alternate threads of said cylindrical coil to different phases of said electrical signal at said first frequency, and means connecting said cylindrical coil to said means for energizing and said means for demodulating to apply said signal at said second frequency across the length of said cylindrical coil and obtain said modulated signal from across the length of said cylindrical coil.

20. The inductive position sensor as claimed in claim 17, wherein said means for modulating is a balanced second harmonic modulator for providing a double sideband suppressed carrier amplitude modulated signal at twice said second frequency.

* * * * *